United States Patent
Huang et al.

(10) Patent No.: US 12,463,166 B2
(45) Date of Patent: Nov. 4, 2025

(54) CHIP STRUCTURE AND METHOD FOR FORMING THE SAME

(71) Applicant: Taiwan Semiconductor Manufacturing Company, Ltd., Hsinchu (TW)

(72) Inventors: Hui-Min Huang, Taoyuan (TW); Ming-Da Cheng, Taoyuan (TW); Wei-Hung Lin, Xinfeng Township (TW); Chang-Jung Hsueh, Taipei (TW); Kai-Jun Zhan, Taoyuan (TW); Yung-Sheng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/741,188

(22) Filed: Jun. 12, 2024

(65) Prior Publication Data
US 2024/0332235 A1    Oct. 3, 2024

Related U.S. Application Data

(63) Continuation of application No. 17/460,906, filed on Aug. 30, 2021, now Pat. No. 12,015,002.

(51) Int. Cl.
*H01L 23/00* (2006.01)

(52) U.S. Cl.
CPC ............ *H01L 24/13* (2013.01); *H01L 24/11* (2013.01); *H01L 24/16* (2013.01); *H01L 2224/13006* (2013.01); *H01L 2224/13009* (2013.01); *H01L 2224/13018* (2013.01); *H01L 2224/16227* (2013.01)

(58) Field of Classification Search
CPC ...................................................... H01L 24/13
See application file for complete search history.

(56) References Cited

U.S. PATENT DOCUMENTS

| | | | |
|---|---|---|---|
| 7,253,531 B1 | 8/2007 | Huang et al. | |
| 7,642,646 B2 | 1/2010 | Nakamura | |
| 8,723,325 B2 | 5/2014 | Chen | |
| 9,059,159 B2 | 6/2015 | Topacio et al. | |

(Continued)

FOREIGN PATENT DOCUMENTS

| | | |
|---|---|---|
| CN | 113628976 A | 11/2021 |
| CN | 114512465 A | 5/2022 |

(Continued)

OTHER PUBLICATIONS

Chinese language office action dated Sep. 7, 2023, issued in application No. TW 111110334.

(Continued)

*Primary Examiner* — William A Harriston
(74) *Attorney, Agent, or Firm* — McClure, Qualey & Rodack, LLP

(57) ABSTRACT

A chip structure is provided. The chip structure includes a substrate. The chip structure includes a first conductive line over the substrate. The chip structure includes an insulating layer over the substrate and the first conductive line. The chip structure includes a conductive pillar over the insulating layer. The chip structure includes a solder bump on the conductive pillar. The solder bump is in direct contact with the conductive pillar.

20 Claims, 24 Drawing Sheets

(56) References Cited

U.S. PATENT DOCUMENTS

| | | |
|---|---|---|
| 9,425,136 B2 | 8/2016 | Kuo |
| 9,716,071 B2 | 7/2017 | Ryu |
| 9,768,135 B2 | 9/2017 | Yao |
| 9,786,618 B2 | 10/2017 | Huang |
| 10,186,493 B2 | 1/2019 | Lin |
| 10,269,703 B2 | 4/2019 | Ku |
| 10,269,737 B2 | 4/2019 | Huang |
| 10,446,522 B2 | 10/2019 | Lin |
| 10,522,485 B2 | 12/2019 | Geissler |
| 10,833,034 B2 | 11/2020 | Chang |
| 10,879,206 B1 | 12/2020 | Wu |
| 10,964,591 B2 | 3/2021 | Hsieh |
| 11,043,482 B2 | 6/2021 | Chen |
| 11,049,827 B2 * | 6/2021 | Choi ............ H01L 24/17 |
| 11,101,233 B1 | 8/2021 | Yen et al. |
| 11,145,562 B2 | 10/2021 | Chang |
| 11,195,816 B2 | 12/2021 | Yu |
| 11,217,482 B2 | 1/2022 | Huang |
| 11,302,649 B2 | 4/2022 | Huang |
| 11,322,450 B2 | 5/2022 | Hu |
| 11,373,968 B2 | 6/2022 | Pang |
| 11,444,021 B2 | 9/2022 | Chen |
| 11,651,994 B2 | 5/2023 | Hsieh et al. |
| 11,908,790 B2 | 2/2024 | Yang |
| 11,955,423 B2 | 4/2024 | Yang |
| 12,015,002 B2 | 6/2024 | Huang |
| 2005/0224991 A1 | 10/2005 | Yeo |
| 2007/0020906 A1 | 1/2007 | Chiu |
| 2009/0283903 A1 | 11/2009 | Park |
| 2010/0187687 A1 | 7/2010 | Liu |
| 2010/0283149 A1 | 11/2010 | Chen |
| 2011/0204510 A1 | 8/2011 | Lin |
| 2011/0254165 A1 | 10/2011 | Muranaka |
| 2012/0074571 A1 | 3/2012 | Lavoie |
| 2013/0032944 A1 | 2/2013 | Sato |
| 2013/0186944 A1 | 7/2013 | Haba et al. |
| 2014/0077365 A1 | 3/2014 | Lin |
| 2016/0118336 A1 | 4/2016 | Yang |
| 2016/0307862 A1 | 10/2016 | Lin |
| 2017/0141056 A1 | 5/2017 | Huang |
| 2018/0033750 A1 | 2/2018 | Huang |
| 2018/0151493 A1 | 5/2018 | Ku |
| 2018/0174981 A1 | 6/2018 | Lu |
| 2018/0233484 A1 | 8/2018 | Lin et al. |
| 2019/0006289 A1 | 1/2019 | Huang |
| 2019/0131287 A1 | 5/2019 | Huang |
| 2020/0013740 A1 | 1/2020 | Bae et al. |
| 2020/0035629 A1 | 1/2020 | Wang |
| 2020/0075540 A1 | 3/2020 | Lu |
| 2020/0105668 A1 | 4/2020 | Ho |
| 2020/0185330 A1 | 6/2020 | Yu |
| 2020/0203299 A1 | 6/2020 | Huang |
| 2020/0294948 A1 | 9/2020 | Lin |
| 2020/0343206 A1 | 10/2020 | Pang |
| 2021/0043591 A1 * | 2/2021 | Choi ............ H01L 24/11 |
| 2021/0217703 A1 | 7/2021 | Chuang et al. |
| 2021/0366877 A1 | 11/2021 | Wu |
| 2021/0375769 A1 | 12/2021 | Cheng |
| 2022/0013461 A1 | 1/2022 | Lin |
| 2022/0093560 A1 | 3/2022 | Yu |
| 2022/0102165 A1 | 3/2022 | Shih |
| 2022/0115349 A1 | 4/2022 | Chu |
| 2022/0157743 A1 | 5/2022 | Mao |
| 2022/0199461 A1 | 6/2022 | Yu |
| 2022/0216143 A1 | 7/2022 | Yang |
| 2022/0270893 A1 | 8/2022 | Lin |
| 2022/0367347 A1 | 11/2022 | Yang et al. |
| 2023/0068503 A1 | 3/2023 | Huang |
| 2023/0253356 A1 | 8/2023 | Huang |
| 2024/0332235 A1 | 10/2024 | Huang |

FOREIGN PATENT DOCUMENTS

| | | |
|---|---|---|
| TW | 200743199 A | 11/2007 |
| TW | 200837918 A | 9/2008 |
| TW | 201017844 A | 5/2010 |
| TW | 201133737 A | 10/2011 |
| TW | 201944503 A | 11/2019 |
| TW | 202008520 A | 2/2020 |

OTHER PUBLICATIONS

Chinese language office action dated May 5, 2023, issued in application No. TW 111125298.

Notice of Allowance dated Nov. 23, 2022, issued in U.S. Appl. No. 17/460,937.

Office Action mailed Feb. 10, 2025 in U.S. Appl. No. 18/302,228.

* cited by examiner

CHIP STRUCTURE AND METHOD FOR FORMING THE SAME

CROSS REFERENCE

This application is a Continuation of U.S. application Ser. No. 17/460,906, filed on Aug. 30, 2021 (now U.S. Pat. No. 12,015,002), the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1C-1 is a top view of a chip structure of FIG. 1C, in accordance with some embodiments.

FIG. 1H-1 is a top view of a chip structure of FIG. 1H, in accordance with some embodiments.

FIG. 3A-1 is a top view of a chip structure of FIG. 3A, in accordance with some embodiments.

FIG. 4A-1 is a top view of a chip structure of FIG. 4A, in accordance with some embodiments.

FIG. 4A-2 is a cross-sectional view illustrating the chip structure along a sectional line II-II' in FIG. 4A-1, in accordance with some embodiments.

DETAILED DESCRIPTION

Figure 1A:
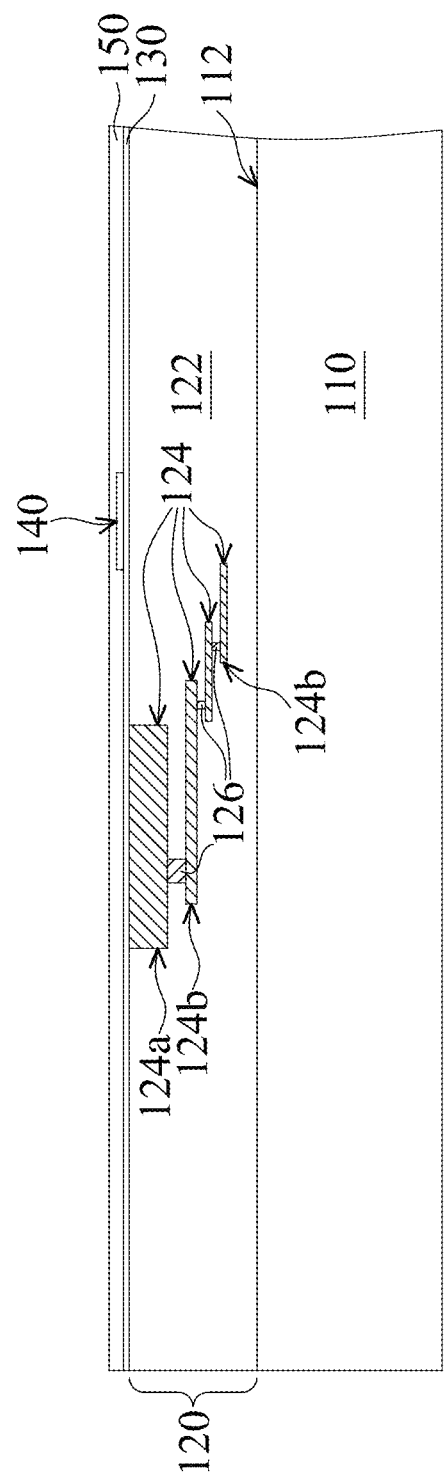
FIGS. 1A-1I are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1I are cross-sectional views of various stages of a process for forming a chip package structure, in accordance with some embodiments. As shown in FIG. 1A, a substrate 110 is provided, in accordance with some embodiments. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an interconnect structure 120 is formed over the substrate 110, in accordance with some embodiments. The interconnect structure 120 includes a dielectric structure 122, wiring layers 124, and conductive vias 126, in accordance with some embodiments. The dielectric structure 122 is formed over a surface 112 of the substrate 110, in accordance with some embodiments.

The wiring layers 124 and the conductive vias 126 are formed in the dielectric structure 122, in accordance with some embodiments. The conductive vias 126 are electrically connected between different wiring layers 124 and between the wiring layer 124 and the aforementioned device elements, in accordance with some embodiments.

The wiring layers 124 include a top metal wiring layer 124a and wiring layers 124b, in accordance with some embodiments. The top metal wiring layer 124a is thicker than the wiring layers 124b, in accordance with some embodiments.

The top metal wiring layer 124a has a thickness ranging from about 0.6 μm to about 1 μm, in accordance with some embodiments. The wiring layer 124b has a thickness ranging from about 0.04 μm to about 0.5 μm, in accordance with some embodiments.

Since the top metal wiring layer 124a is thicker than the wiring layers 124b, the top metal wiring layer 124a is able to withstand greater bonding stress in a subsequent bonding process than the wiring layers 124b and able to suppress stress migration to the wiring layers 124b therebelow, in accordance with some embodiments.

The dielectric structure 122 is made of an oxide-containing material (e.g. silicon oxide or undoped silicate glass) or another suitable insulating material, in accordance with some embodiments. The wiring layers 124 and the conductive vias 126 are made of conductive materials such as metal (e.g., aluminum, copper or tungsten) or alloys thereof, in accordance with some embodiments.

As shown in FIG. 1A, a passivation layer 130 is formed over the interconnect structure 120, in accordance with some embodiments. The passivation layer 130 is used as an anti-acid layer to prevent acid (used in subsequent processes) from penetrating into the interconnect structure 120, in accordance with some embodiments.

The passivation layer 130 is made of a dielectric material, such as an oxide-containing material (e.g., silicon oxide or undoped silicate glass (USG)), in accordance with some embodiments. The passivation layer 130 is formed using a deposition process (e.g., a chemical vapor deposition process or a physical vapor deposition process), in accordance with some embodiments.

As shown in FIG. 1A, a metal-insulator-metal (MIM) capacitor 140 is formed over the passivation layer 130, in accordance with some embodiments. The MIM capacitor 140 includes a bottom metal layer (not shown), an insulating layer (not shown), and a top metal layer (not shown), in accordance with some embodiments. The insulating layer is sandwiched between the bottom metal layer and the top metal layer, in accordance with some embodiments.

The bottom metal layer and the top metal layer are made of titanium (Ti), titanium nitride (TiN), tantalum (Ta), tantalum nitride (TaN), copper (Cu), copper alloy, aluminum (Al), aluminum (Al) alloy, copper aluminum alloy (AlCu), tungsten (W), or tungsten (W) alloy, in accordance with some embodiments. The bottom metal layer and the top metal layer are formed by a procedure including depositing, photolithography, and etching processes.

The deposition processes include chemical vapor deposition (CVD), physical vapor deposition (PVD), atomic layer deposition (ALD), or applicable methods. The photolithography processes include photoresist coating (e.g., spin-on coating), soft baking, mask aligning, exposure, post-exposure baking, developing the photoresist, rinsing, and drying (e.g., hard baking), in accordance with some embodiments. The etching processes include dry etching, wet etching, and/or other etching methods.

The insulating layer is made of dielectric materials, such as silicon oxide, silicon nitride or silicon glass. In some embodiments, the insulating layer is formed by a chemical vapor deposition (CVD) process or physical vapor deposition (PVD) process.

As shown in FIG. 1A, a passivation layer 150 is formed over the passivation layer 130 and the MIM capacitor 140, in accordance with some embodiments. The passivation layer 150 is used as a waterproof layer to prevent water from penetrating into the interconnect structure 120, in accordance with some embodiments.

The passivation layer 150 is made of a dielectric material, such as a nitride-containing material (e.g., silicon nitride or silicon oxynitride), in accordance with some embodiments. The passivation layer 150 is formed using a deposition process (e.g., a chemical vapor deposition process or a physical vapor deposition process), in accordance with some embodiments.

Figure 1B:
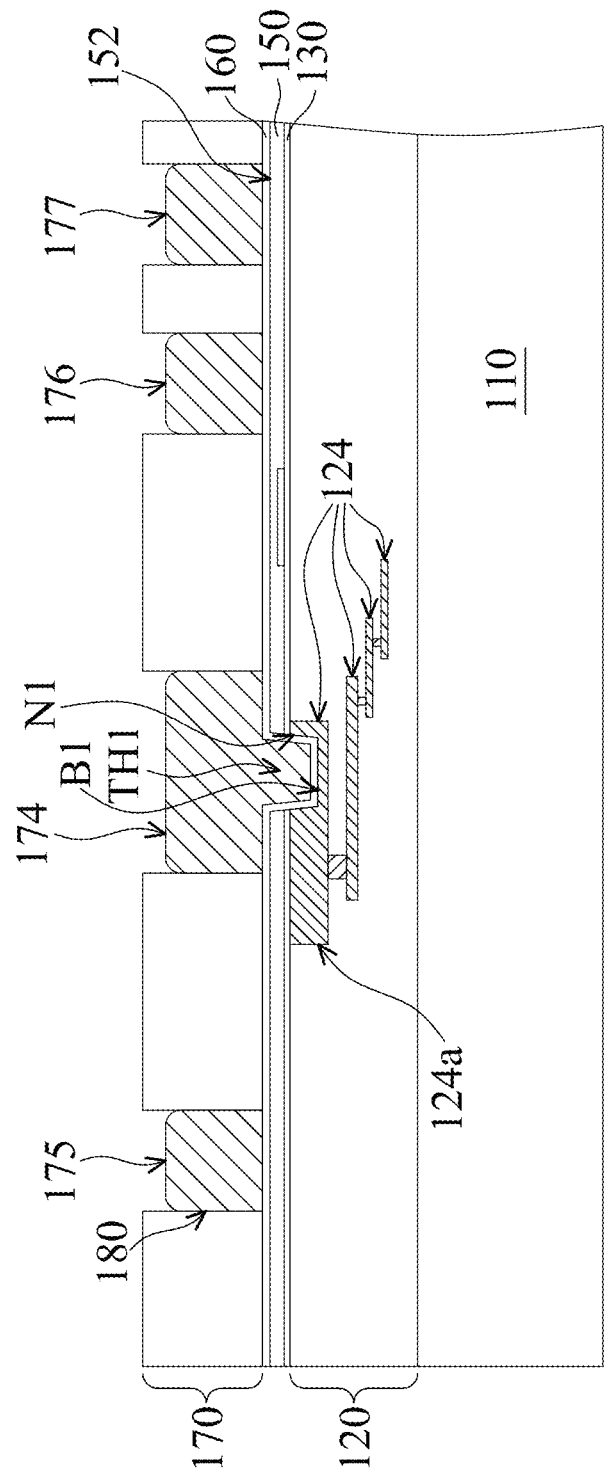

As shown in FIG. 1B, portions of the passivation layers 130 and 150 are removed to form a through hole TH1 in the passivation layers 130 and 150, in accordance with some embodiments. In some embodiments, the through hole TH1 further extends into the top metal wiring layer 124a. The through hole TH1 exposes a portion of the top metal wiring layer 124a, in accordance with some embodiments. The removal process includes a photolithography process and an etching process, such as a dry etching process, in accordance with some embodiments.

Thereafter, a barrier layer (not shown) is conformally formed over the passivation layers 130 and 150 and in the through hole TH1, in accordance with some embodiments. The barrier layer is made of nitrides such as tantalum nitride (TaN), in accordance with some embodiments. The barrier layer is formed using a deposition process, such as a physical vapor deposition process, in accordance with some embodiments.

As shown in FIG. 1B, a seed layer 160 is conformally formed over the barrier layer (not shown), in accordance with some embodiments. In some embodiments, the barrier layer is not formed. The seed layer 160 conformally covers a bottom surface B1 and inner walls N1 of the through hole TH1, in accordance with some embodiments.

The seed layer 160 is made of a conductive material, such as metal (e.g., copper, aluminum, gold, silver, or tungsten) or alloys thereof, in accordance with some embodiments. The seed layer 160 is formed using a deposition process, such as a physical vapor deposition process, in accordance with some embodiments.

As shown in FIG. 1B, a mask layer 170 is formed over the seed layer 160, in accordance with some embodiments. The mask layer 170 has trenches 174, 175, 176 and 177 exposing portions of the seed layer 160, in accordance with some embodiments. The trench 174 exposes a portion of the seed layer 160 in the through hole TH1 and a portion of the seed layer 160 over a top surface 152 of the passivation layer 150, in accordance with some embodiments. The trench 174 is wider than the trench 175, 176 or 177, in accordance with some embodiments. The mask layer 170 is made of a polymer material, such as a photoresist material, in accordance with some embodiments.

After the mask layer 170 is formed, a descum process is performed over the seed layer 160 exposed by the trenches 174, 175, 176 and 177 to remove the residues thereover, in accordance with some embodiments. The descum process includes an etching process such as a plasma etching process, in accordance with some embodiments.

As shown in FIG. 1B, a conductive layer 180 is formed over the seed layer 160 exposed by the trenches 174, 175, 176 and 177, in accordance with some embodiments. The conductive layer 180 is made of a conductive material, such as metal (e.g., copper) or alloys thereof, in accordance with some embodiments. The conductive layer 180 is formed by a plating process, such as an electroplating process, in accordance with some embodiments.

Figure 1C:
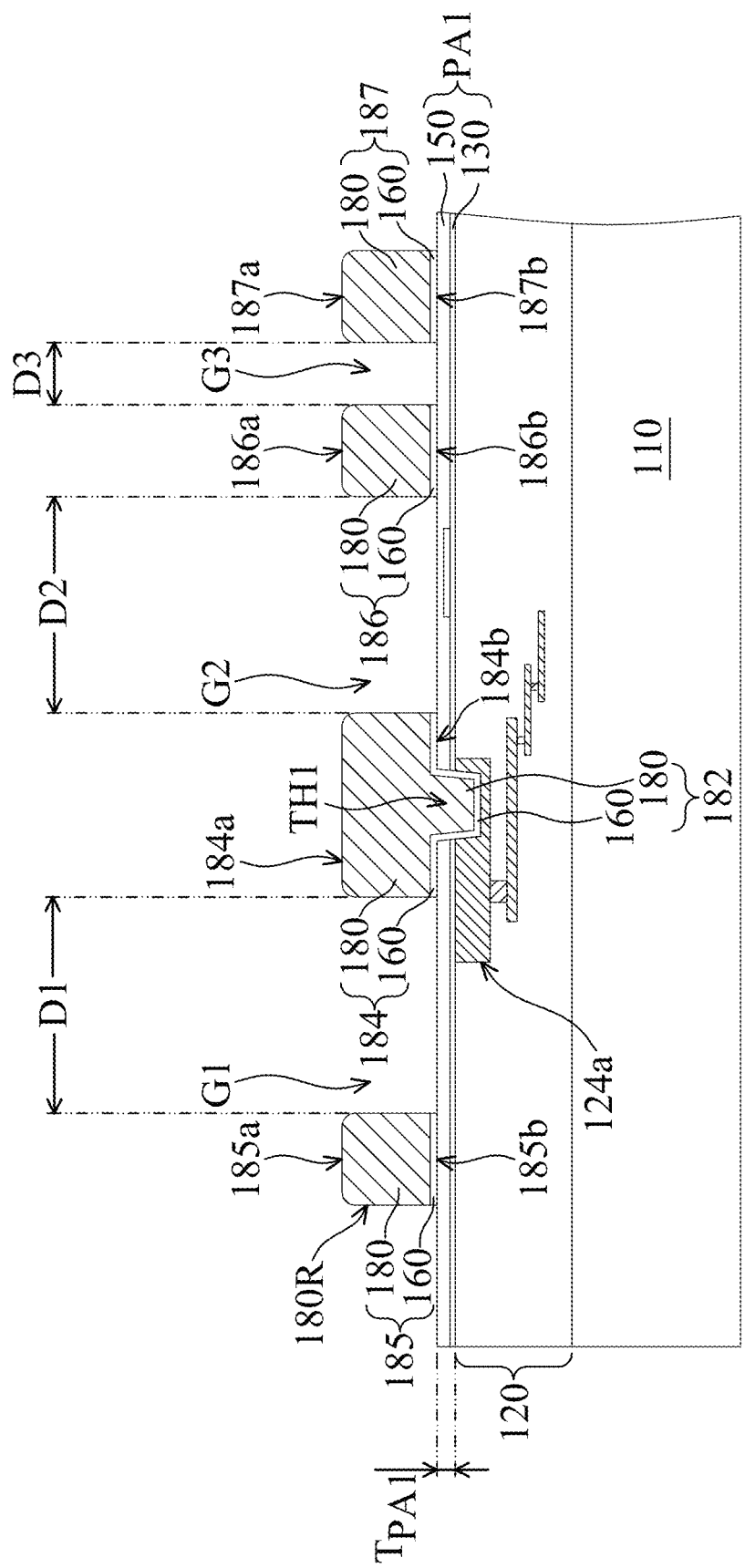

As shown in FIG. 1C, the mask layer 170 is removed, in accordance with some embodiments. As shown in FIG. 1C, the seed layer 160 originally under the mask layer 170 is removed, in accordance with some embodiments. The removal process includes an etching process such as a wet etching process, in accordance with some embodiments.

Thereafter, the barrier layer (not shown), which is not covered by the conductive layer 180, is removed, in accordance with some embodiments. The removal process includes an etching process such as a dry etching process, in accordance with some embodiments.

The passivation layers 130 and 150 together form a first passivation layer PA1, in accordance with some embodiments. The first passivation layer PA1 has a thickness TPA1 ranging from about 0.2 µm to about 0.8 µm, in accordance with some embodiments.

Figures 1, 1C:
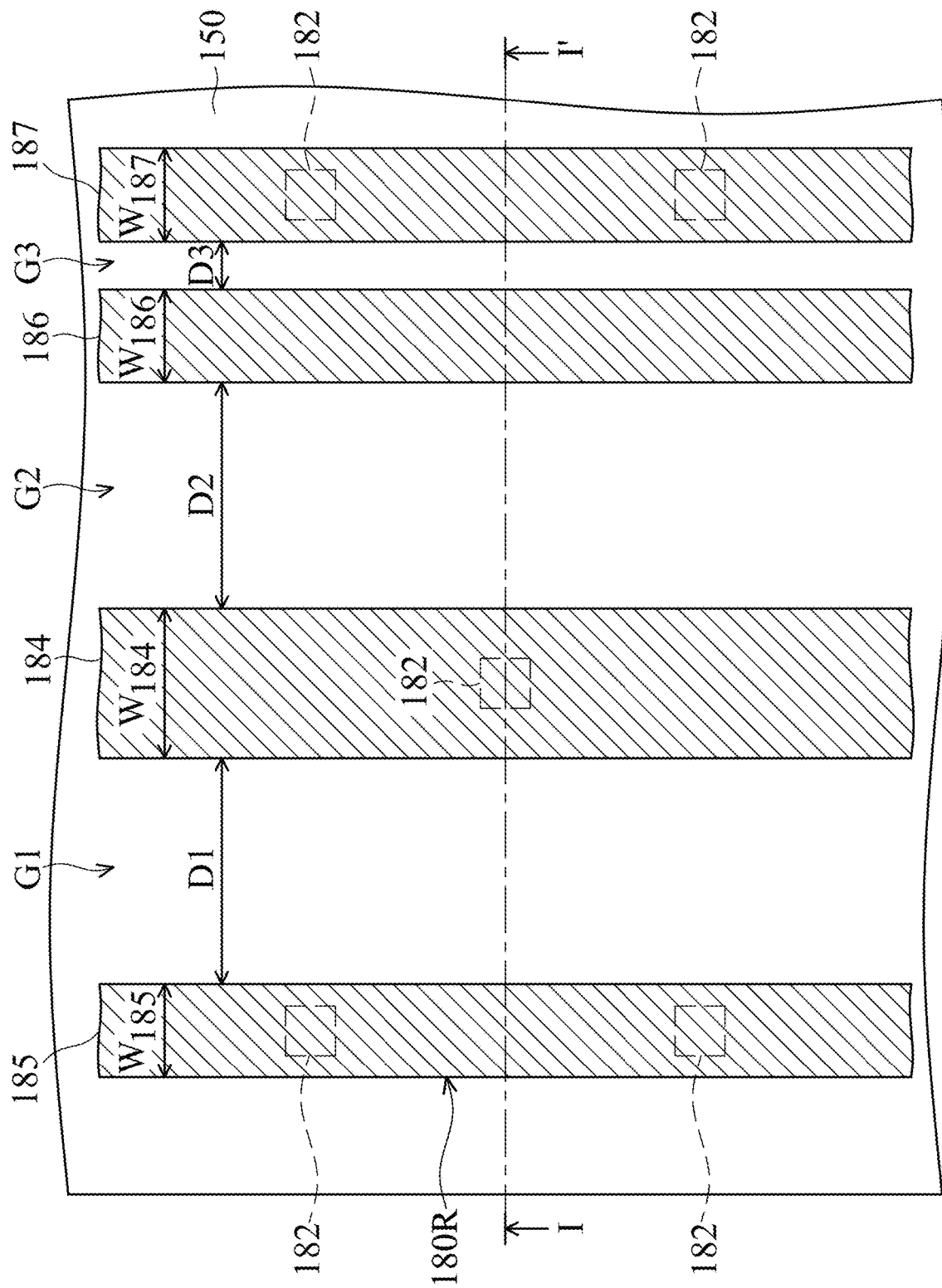

FIG. 1C-1 is a top view of a chip structure of FIG. 1C, in accordance with some embodiments. As shown in FIGS. 1C and 1C-1, the conductive layer 180 in the through hole TH1 and the seed layer 160 thereunder together form a conductive via structure 182, in accordance with some embodiments. The conductive via structure 182 pass through the passivation layers 130 and 150, in accordance with some embodiments. In some embodiments, the conductive via structure 182 have an inverted trapezoid shape.

As shown in FIGS. 1B, 1C, and 1C-1, the conductive layer 180, originally in the trench 174, and the seed layer 160 thereunder together form a conductive line 184, in accordance with some embodiments. The conductive line 184 has a linewidth $W_{184}$ ranging from about 10 µm to about 50 µm, in accordance with some embodiments. The conductive via structure 182 is directly connected between the conductive line 184 and the conductive line 124a thereunder, in accordance with some embodiments.

The conductive layer 180, originally in the trench 175, and the seed layer 160 thereunder together form a conductive line 185, in accordance with some embodiments. The conductive line 185 has a linewidth $W_{185}$ ranging from about 2 µm to about 50 µm, in accordance with some embodiments. In some embodiments, the conductive line 185 is electrically connected to the wiring layer 124a. In some other embodiments, the conductive line 185 is a dummy element such as a dummy line, a dummy pad, or the like.

The conductive layer 180, originally in the trench 176, and the seed layer 160 thereunder together form a conductive line 186, in accordance with some embodiments. The conductive line 186 has a linewidth $W_{186}$ ranging from about 2 µm to about 50 µm, in accordance with some embodiments. In some embodiments, the conductive line 186 is electrically connected to the wiring layer 124a. In some other embodiments, the conductive line 186 is a dummy element such as a dummy line, a dummy pad, or the like.

The conductive layer 180, originally in the trench 177, and the seed layer 160 thereunder together form a conductive line 187, in accordance with some embodiments. The conductive line 187 has a linewidth $W_{187}$ ranging from about 2 µm to about 50 µm, in accordance with some embodiments.

In some embodiments, the linewidth $W_{184}$ is greater than the linewidth $W_{185}$, $W_{186}$, or $W_{187}$, which increase the alignment tolerance between the conductive line 184 and a conductive pillar subsequently formed thereon. In some embodiments, a ratio of the linewidth $W_{184}$ to the linewidth $W_{185}$, $W_{186}$, or $W_{187}$ ranges from about 1.5 to about 2.5. If the ratio is less than 1.5, the alignment tolerance between the conductive line 184 and the conductive pillar may be unable to be increased. If the ratio is greater than 2.5, the conductive line 184 may occupy too much layout space.

The conductive lines 184, 185, 186, and 187 together form a wiring layer 180R, in accordance with some embodiments. The wiring layer 180R is thicker than the wiring layers 124, in accordance with some embodiments. The wiring layer 180R has a thickness $T_{180R}$ ranging from about 2 µm to about 10 µm, in accordance with some embodiments.

The conductive lines 184 and 185 are spaced apart from each other by a gap G1, in accordance with some embodiments. In some embodiments, a distance D1 is between the conductive lines 184 and 185. The conductive lines 184 and 186 are spaced apart from each other by a gap G2, in accordance with some embodiments. In some embodiments, a distance D2 is between the conductive lines 184 and 186. The conductive lines 186 and 187 are spaced apart from each other by a gap G3, in accordance with some embodiments. In some embodiments, a distance D3 is between the conductive lines 186 and 187.

In some embodiments, the distance D1 is substantially equal to the distance D2. In some embodiments, the distance D1 or D2 is greater than the distance D3. In some embodiments, an average distance between center portions of adjacent two of the conductive lines 184, 185, 186, and 187 ranges from about 20 nm to 300 µm. The average distance between center portions of adjacent two of the conductive lines 184, 185, 186, and 187 is also referred to as an average pitch, in accordance with some embodiments. In some embodiments, a ratio of the distance D1 or D2 to the average pitch of the conductive lines 184, 185, 186, and 187 is substantially equal to or greater than 1.

The conductive line 184 has a top surface 184a and a lower surface 184b, in accordance with some embodiments. The conductive line 185 has a top surface 185a and a lower surface 185b, in accordance with some embodiments. The conductive line 186 has a top surface 186a and a lower surface 186b, in accordance with some embodiments. The conductive line 187 has a top surface 187a and a lower surface 187b, in accordance with some embodiments.

The top surface 184a is substantially level with (or coplanar with) the top surfaces 185a, 186a, and 187a of the conductive lines 185, 186, and 187, in accordance with some embodiments. The lower surface 184b is substantially level with (or coplanar with) the lower surfaces 185b, 186b, and 187b of the conductive lines 185, 186, and 187, in accordance with some embodiments. As shown in FIG. 1C-1, the conductive lines 184, 185, 186, and 187 are substantially parallel to each other, in accordance with some embodiments.

Figure 1D:
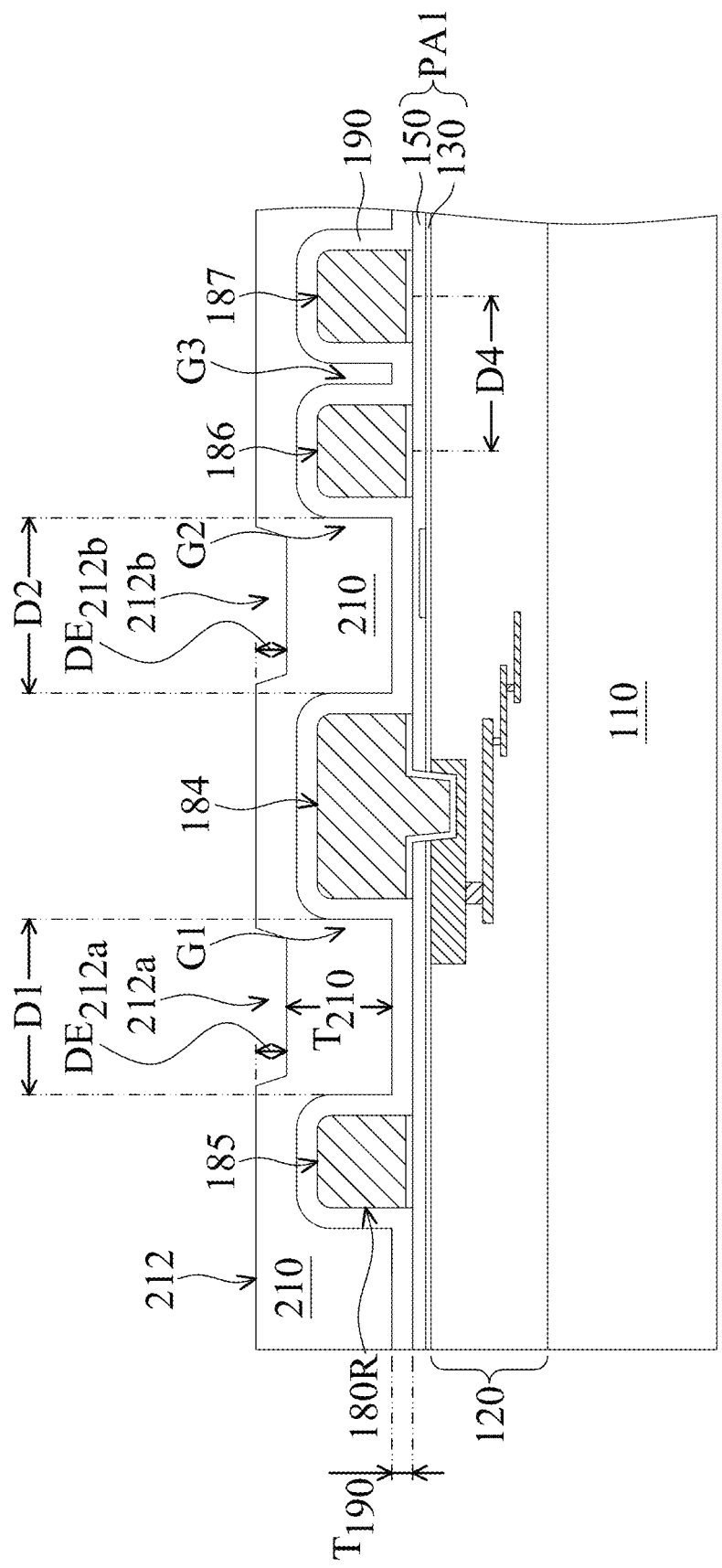

As shown in FIG. 1D, a passivation layer 190 is conformally formed over the passivation layer 150 and the wiring layer 180R, in accordance with some embodiments. The passivation layer 190 conformally covers the conductive lines 184, 185, 186, and 187 and the gaps G1, G2, and G3 therebetween, in accordance with some embodiments. The passivation layer 190 is thicker than the first passivation layer PA1, in accordance with some embodiments. The passivation layer 190 has a thickness $T_{190}$ ranging from about 0.8 µm to about 1.7 µm, in accordance with some embodiments.

The passivation layer 190 is made of a dielectric material, such as nitrides (e.g., silicon nitride or silicon oxynitride), in accordance with some embodiments. The passivation layer 190 is formed using a deposition process (e.g., a chemical vapor deposition process or a physical vapor deposition process), in accordance with some embodiments.

As shown in FIG. 1D, an insulating layer 210 is formed over the passivation layer 190, in accordance with some embodiments. The insulating layer 210 is a single-layered structure, in accordance with some embodiments. The gaps G1, G2, and G3 are filled with the insulating layer 210, in accordance with some embodiments.

The insulating layer 210 has a top surface 212, in accordance with some embodiments. The top surface 212 has recesses 212a and 212b, in accordance with some embodiments. The recess 212a is over the gap G1, in accordance with some embodiments. The recess 212b is over the gap G2, in accordance with some embodiments. The recess 212a has a depth $DE_{212a}$ ranging from about 0.5 nm to about 150 µm, in accordance with some embodiments. In some embodiments, the recesses 212a and 212b are formed due to the surface profile of the passivation layer 190, such as the lager recesses above the gap G1 and the gap G2. In some alternative embodiments, the positions and shapes of the recesses 212a and 212b can be adjusted by patterning processes.

The recess 212b has a depth $DE_{212b}$ ranging from about 0.5 nm to about 150 µm, in accordance with some embodiments. In some embodiments, a ratio of the depth $DE_{212a}$ or $DE_{212b}$ to the average pitch of the conductive lines 184, 185, 186, and 187 ranges from about 0.05 to about 0.5.

The insulating layer 210 has a thickness $T_{210}$ ranging from about 5 nm to about 1500 µm, in accordance with some embodiments. In some embodiments, a ratio of the distance D1 or D2 to the thickness $T_{210}$ is substantially equal to or greater than 1. In some embodiments, a ratio of the distance D1 or D2 to the average pitch of the conductive lines 184, 185, 186, and 187 is substantially equal to or greater than 1. If the ratio of the distance D1 or D2 to the thickness $T_{210}$ or to the average pitch of the conductive lines 184, 185, 186, and 187 is less than 1, the recesses 212a and 212b may be not formed.

In some embodiments, a ratio of the thickness $T_{210}$ to the average pitch of the conductive lines 184, 185, 186, and 187 ranges from about 0.2 to about 5. The insulating layer 210 is made of a polymer material such as polyimide (PI), in accordance with some embodiments.

Figure 1E:
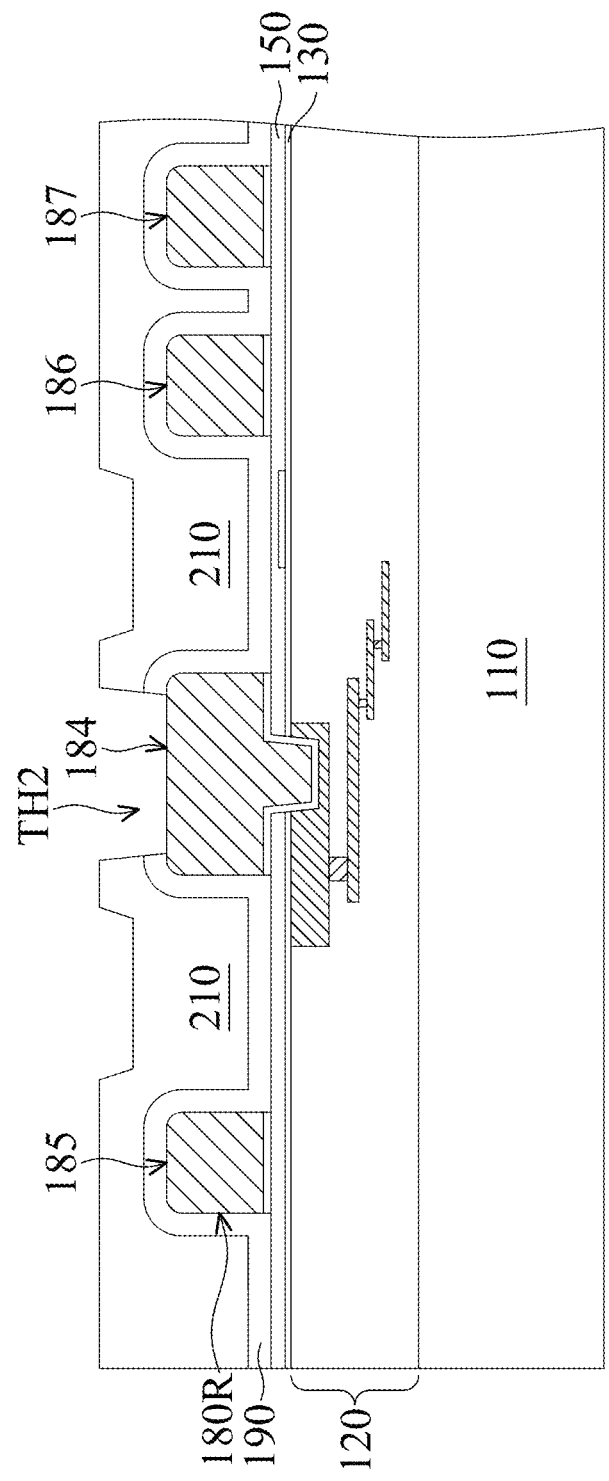

As shown in FIG. 1E, portions of the insulating layer 210 and the passivation layer 190 over the conductive line 184 are removed to form a through hole TH2 in the insulating layer 210 and the passivation layer 190, in accordance with some embodiments. The through hole TH2 exposes a portion of the conductive line 184, in accordance with some embodiments. The removal process includes an etching process such as a dry etching process, in accordance with some embodiments.

Thereafter, a seed layer (not shown) is conformally formed over the passivation layer 190, the insulating layer 210, and the conductive line 184, in accordance with some embodiments. The seed layer is in direct contact with the passivation layer 190, the insulating layer 210, and the conductive line 184, in accordance with some embodiments.

The seed layer is made of a conductive material, such as metal (e.g., copper, aluminum, gold, silver, or tungsten) or alloys thereof, in accordance with some embodiments. The seed layer is formed using a deposition process, such as a physical vapor deposition process, in accordance with some embodiments.

Figure 1F:
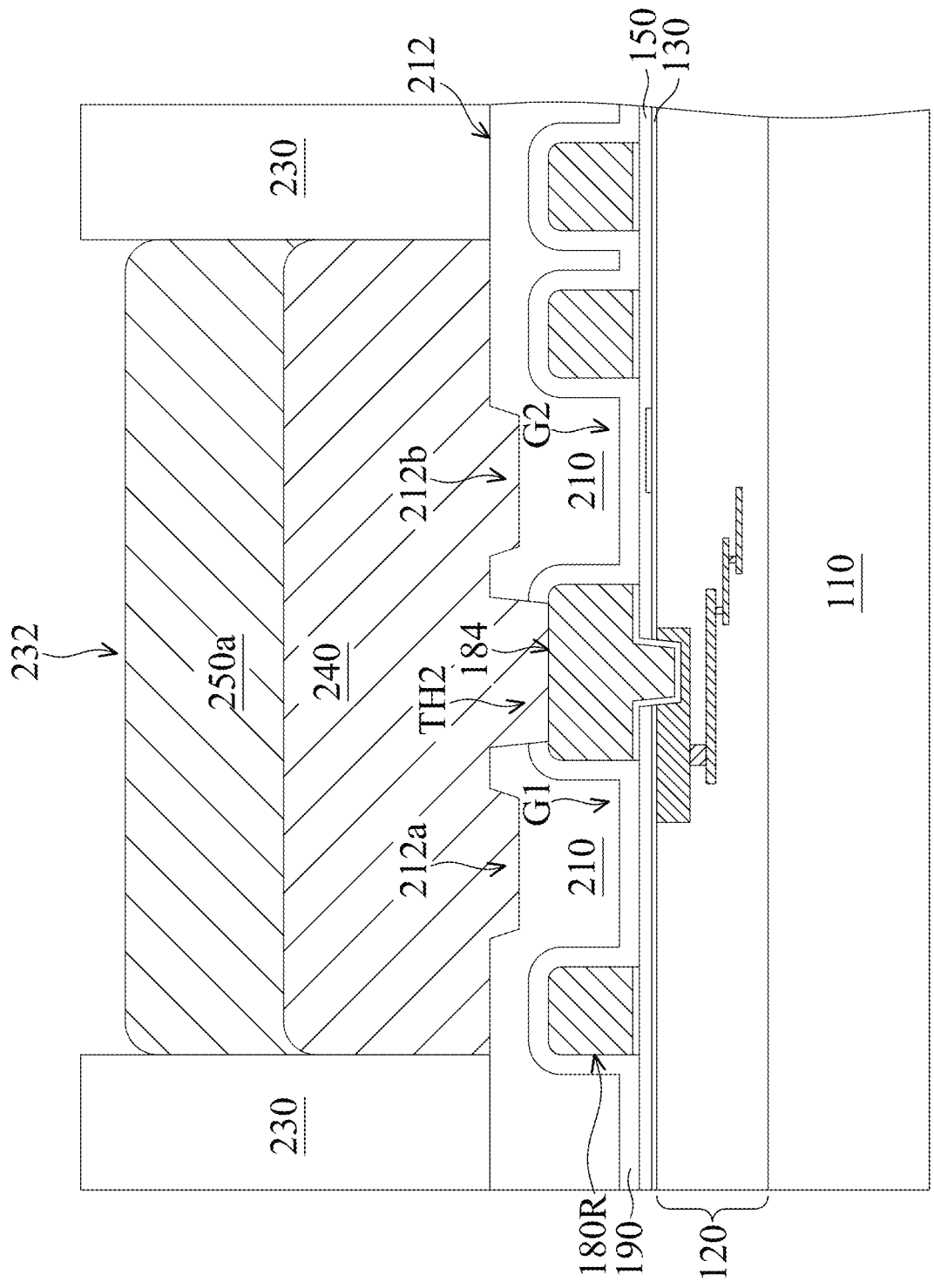

As shown in FIG. 1F, a mask layer 230 is formed over the seed layer (not shown), in accordance with some embodiments. The mask layer 230 has an opening 232 exposing a portion of the seed layer, in accordance with some embodiments. The mask layer 230 is made of a polymer material, such as a photoresist material, in accordance with some embodiments.

As shown in FIG. 1F, a conductive pillar 240 is formed over the seed layer exposed by the opening 232, in accordance with some embodiments. Since the seed layer is very thin, the seed layer may be seen as a portion of the conductive pillar 240, in accordance with some embodiments. The conductive pillar 240 is also referred to as a conductive bump, in accordance with some embodiments. The conductive pillar 240 is filled into the recesses 212a and 212b and the through hole TH2 of the insulating layer 210, in accordance with some embodiments.

The conductive pillar 240 is made of a conductive material, such as metal (e.g., titanium, copper, nickel, or aluminum) or alloys thereof, in accordance with some embodiments. The conductive pillar 240 is formed using a plating process, such as an electroplating process, in accordance with some embodiments.

As shown in FIG. 1F, a solder layer 250a is formed over the conductive pillar 240, in accordance with some embodiments. The solder layer 250a is made of a conductive material, such as metal (e.g., tin or the like) or alloys thereof, in accordance with some embodiments. The solder layer 250a is formed using a plating process, such as an electroplating process, in accordance with some embodiments.

Figure 1G:
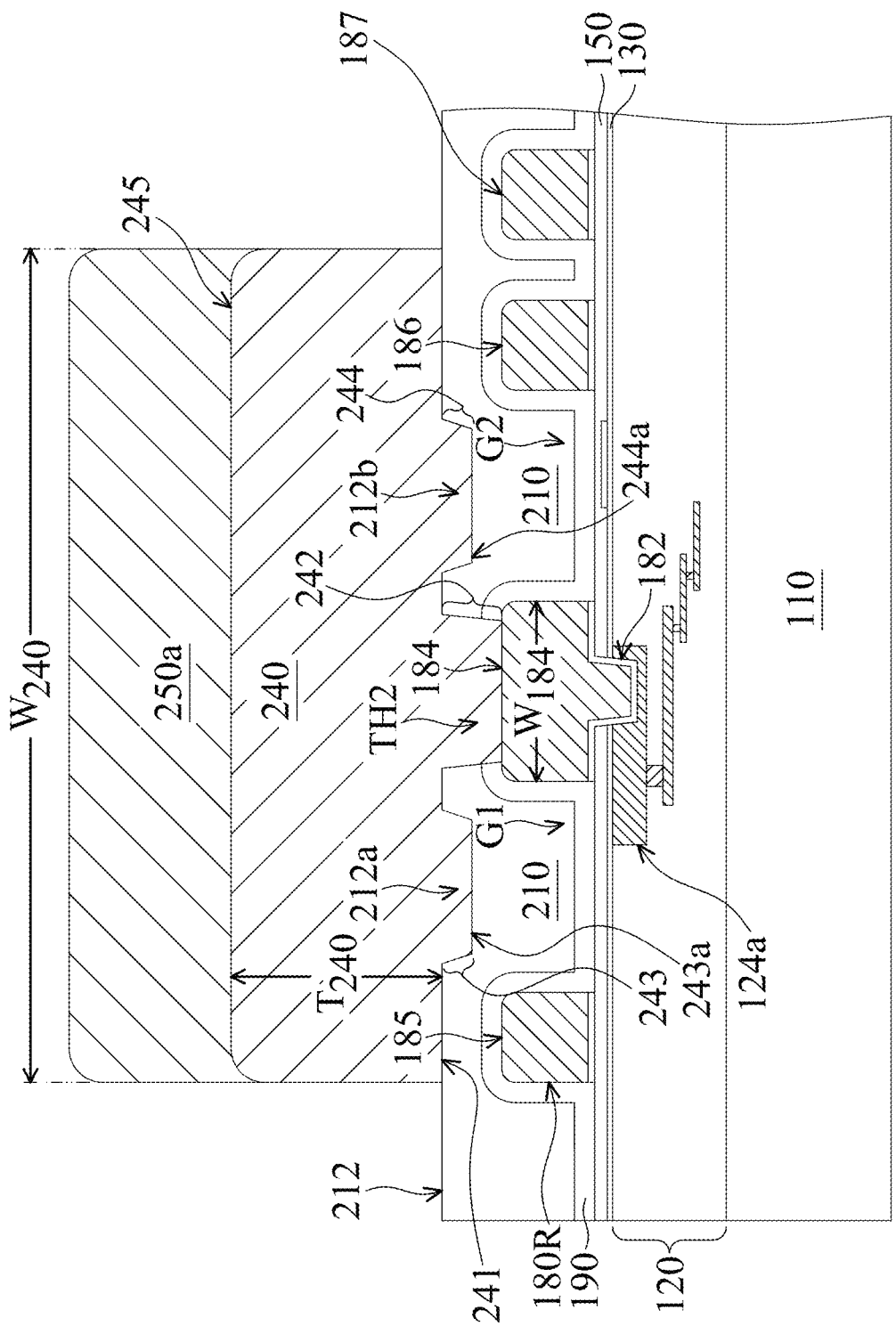

As shown in FIG. 1G, the mask layer 230 is removed, in accordance with some embodiments. The seed layer originally under the mask layer 230 is removed as well, in accordance with some embodiments. The removal process includes an etching process such as a wet etching process, in accordance with some embodiments.

The conductive pillar 240 is over the conductive lines 184, 185, and 186, in accordance with some embodiments. The conductive pillar 240 is formed in one piece, in accordance with some embodiments. The conductive pillar 240 has a lower surface 241, a protruding connecting portion 242, protruding locking portions 243 and 244, and an upper surface 245, in accordance with some embodiments.

The protruding connecting portion 242 protrudes from the lower surface 241, in accordance with some embodiments. The protruding connecting portion 242 is in the through hole TH2, in accordance with some embodiments. The protruding connecting portion 242 passes through the insulating layer 210 and the passivation layer 190, in accordance with some embodiments.

The protruding connecting portion 242 is in direct contact with the conductive line 184, in accordance with some embodiments. The conductive via structure 182 is under the protruding connecting portion 242, which shortens the conductive path between the conductive pillar 240 and the wiring layer 124a, in accordance with some embodiments.

The protruding locking portions 243 and 244 protrude from the lower surface 241, in accordance with some embodiments. The protruding locking portions 243 and 244 are embedded in the insulating layer 210, in accordance with some embodiments. The protruding locking portions 243 and 244 are in the recesses 212a and 212b respectively, in accordance with some embodiments.

The protruding locking portion 243 has an end surface 243a facing the substrate 110, in accordance with some embodiments. The protruding locking portion 244 has an end surface 244a facing the substrate 110, in accordance with some embodiments. In some embodiments, portions of the insulating layer 210 are between the end surfaces 243a and 244a and the substrate 110.

In some embodiments, the linewidth $W_{184}$ of the conductive line 184 under the conductive pillar 240 is less than a width $W_{240}$ of the conductive pillar 240. The width $W_{240}$ ranges from about 10 µm to about 500 µm, in accordance with some embodiments. The conductive pillar 240 has a thickness $T_{240}$ ranges from about 10 µm to about 100 µm, in accordance with some embodiments. The upper surface 245 is a planar surface, in accordance with some embodiments.

Figure 1H:
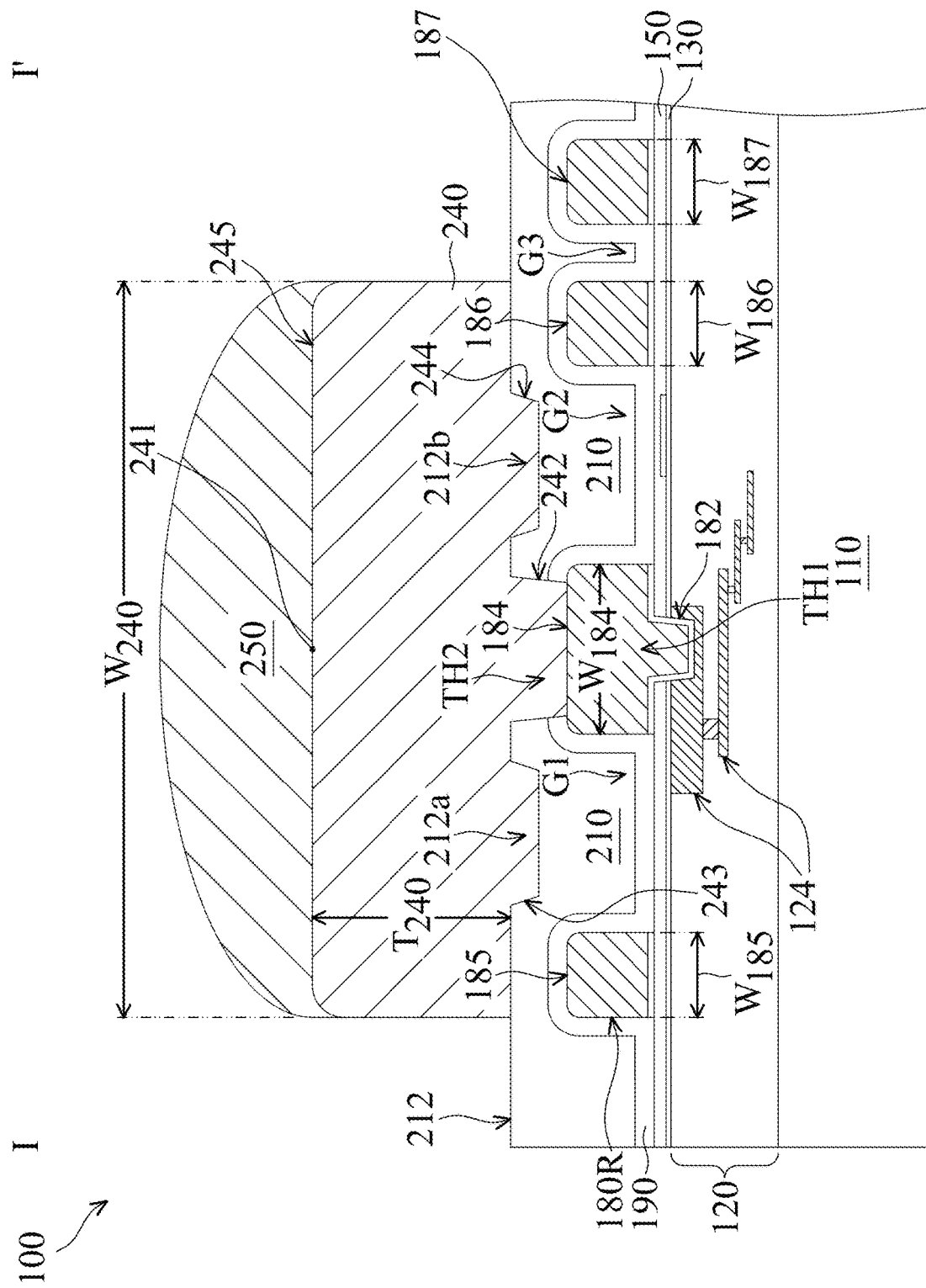
Figures 1, 1H:
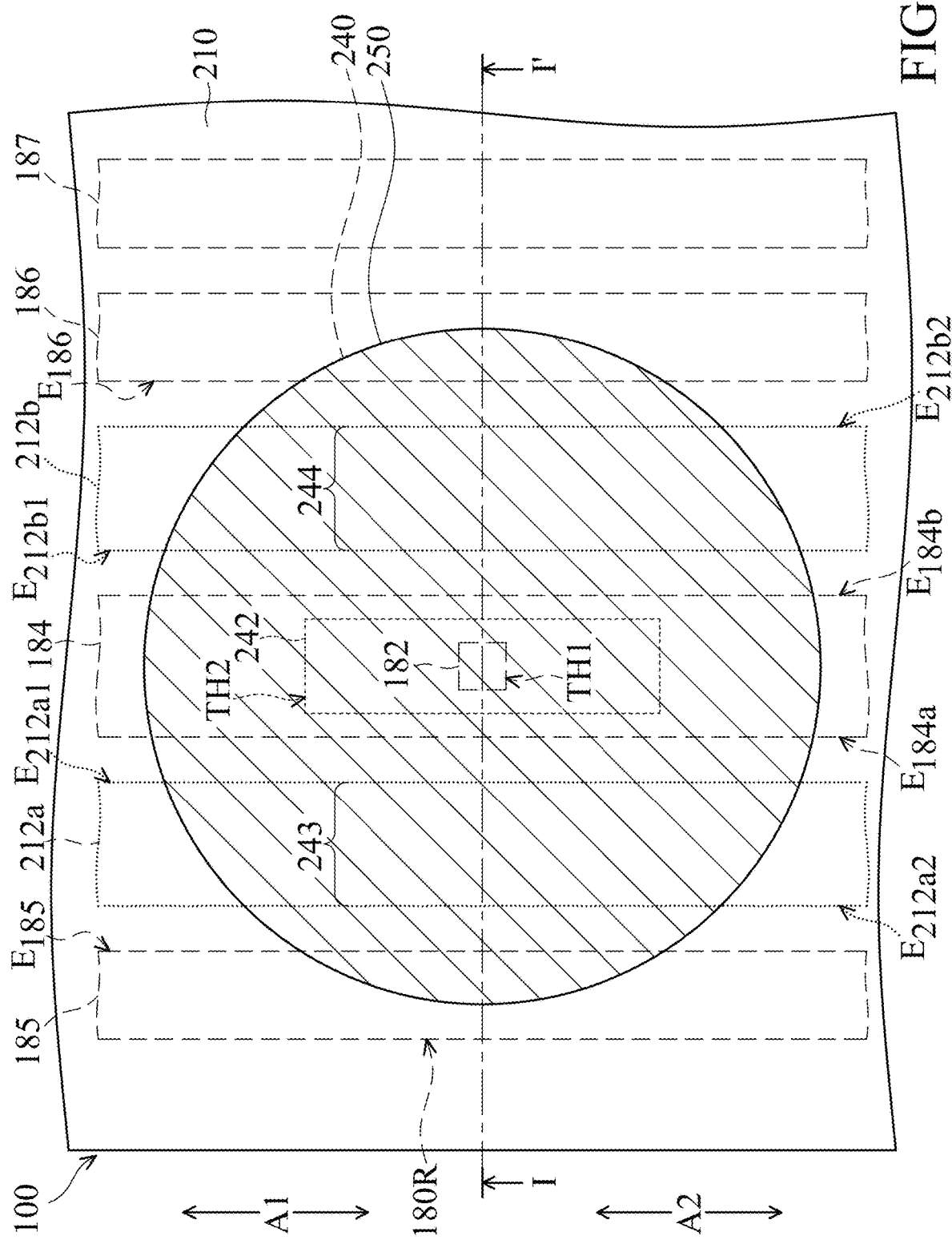

FIG. 1H-1 is a top view of the chip structure of FIG. 1H, in accordance with some embodiments. As shown in FIGS. 1G, 1H and 1H-1, a reflow process is performed over the solder layer 250a to form a solder bump 250, in accordance with some embodiments. The solder bump 250 is in direct contact with the conductive pillar 240, in accordance with some embodiments. In this step, a chip structure 100 is substantially formed, in accordance with some embodiments.

As shown in FIG. 1H-1, the through hole TH2 and the protruding connecting portion 242 have a strip shape, such as a rectangle shape, in accordance with some embodiments. In some embodiments, a longitudinal axis A1 of the through hole TH2 or the protruding connecting portion 242 is substantially parallel to a portion of the conductive line 184 under the conductive pillar 240.

As shown in FIG. 1H-1, an edge $E_{212a1}$ of the recess 212a is substantially parallel to an edge $E_{184a}$ of the conductive line 184, in accordance with some embodiments. In some embodiments, an edge $E_{212a2}$ of the recess 212a is substantially parallel to an edge $E_{185}$ of the conductive line 185. In some embodiments, an edge $E_{212b1}$ of the recess 212b is substantially parallel to an edge $E_{184b}$ of the conductive line 184. In some embodiments, an edge $E_{212b2}$ of the recess 212b is substantially parallel to an edge $E_{186}$ of the conductive line 186.

As shown in FIG. 1H-1, the protruding locking portion 243 of the conductive pillar 240 is between the conductive lines 184 and 185, in accordance with some embodiments. The recess 212a is between the conductive lines 184 and 185, in accordance with some embodiments. There is no conductive line between the conductive lines 184 and 185, in accordance with some embodiments.

The protruding locking portion 244 of the conductive pillar 240 is between the conductive lines 184 and 186, in accordance with some embodiments. The recess 212b is between the conductive lines 184 and 186, in accordance with some embodiments. There is no conductive line between the conductive lines 184 and 186, in accordance with some embodiments.

As shown in FIG. 1H-1, the protruding locking portions 243 and 244 have a strip shape, in accordance with some embodiments. In some embodiments, a longitudinal axis A2 of the protruding locking portion 243 or 244 is substantially parallel to a portion of the conductive line 184 under the conductive pillar 240. The longitudinal axis A1 of the protruding connecting portion 242 is substantially parallel to the longitudinal axis A2 of the protruding locking portion 243 or 244, in accordance with some embodiments.

The formation of the protruding locking portions 243 and 244 is able to increase the contact area (or the bonding area) between the conductive pillar 240 and the insulating layer 210 to improve the adhesion between the conductive pillar 240 and the insulating layer 210, in accordance with some embodiments. The protruding locking portions 243 and 244 are able to withstand a shear stress resulting from thermal expansion mismatches between the substrate 110 and a wiring substrate subsequently bonded with the solder bump 250, in accordance with some embodiments. Therefore, the design of the protruding locking portions 243 and 244 facilitates locking of the conductive pillar 240 to the insulating layer 210, in accordance with some embodiments. As a result, the reliability of the chip structure 100 is improved, in accordance with some embodiments.

The material property of copper may reduce the stress migration and the electromigration effect, in accordance with some embodiments. Therefore, if the conductive line 184 and the conductive via structure 182 are made of copper, the stress migration and the electromigration effect are reduced, in accordance with some embodiments.

The (thick) insulating layer 210 is able to absorb a portion of the bonding stress in a subsequent bonding process, which reduces the bonding stress transmitted to the wiring layers 180R and 124 therebelow, in accordance with some embodiments. Therefore, there is no need to form conductive pads in the wiring layer 180R under the conductive pillar 240, in accordance with some embodiments. Therefore, the conductive pad is replaced by the conductive line 184, which is narrower than the conductive pad, in accordance with some embodiments. As a result, the (narrower) conductive line 184 may reserve more space under the conductive pillar 240 for wiring layout than the conductive pads, in accordance with some embodiments.

Figure 1I:
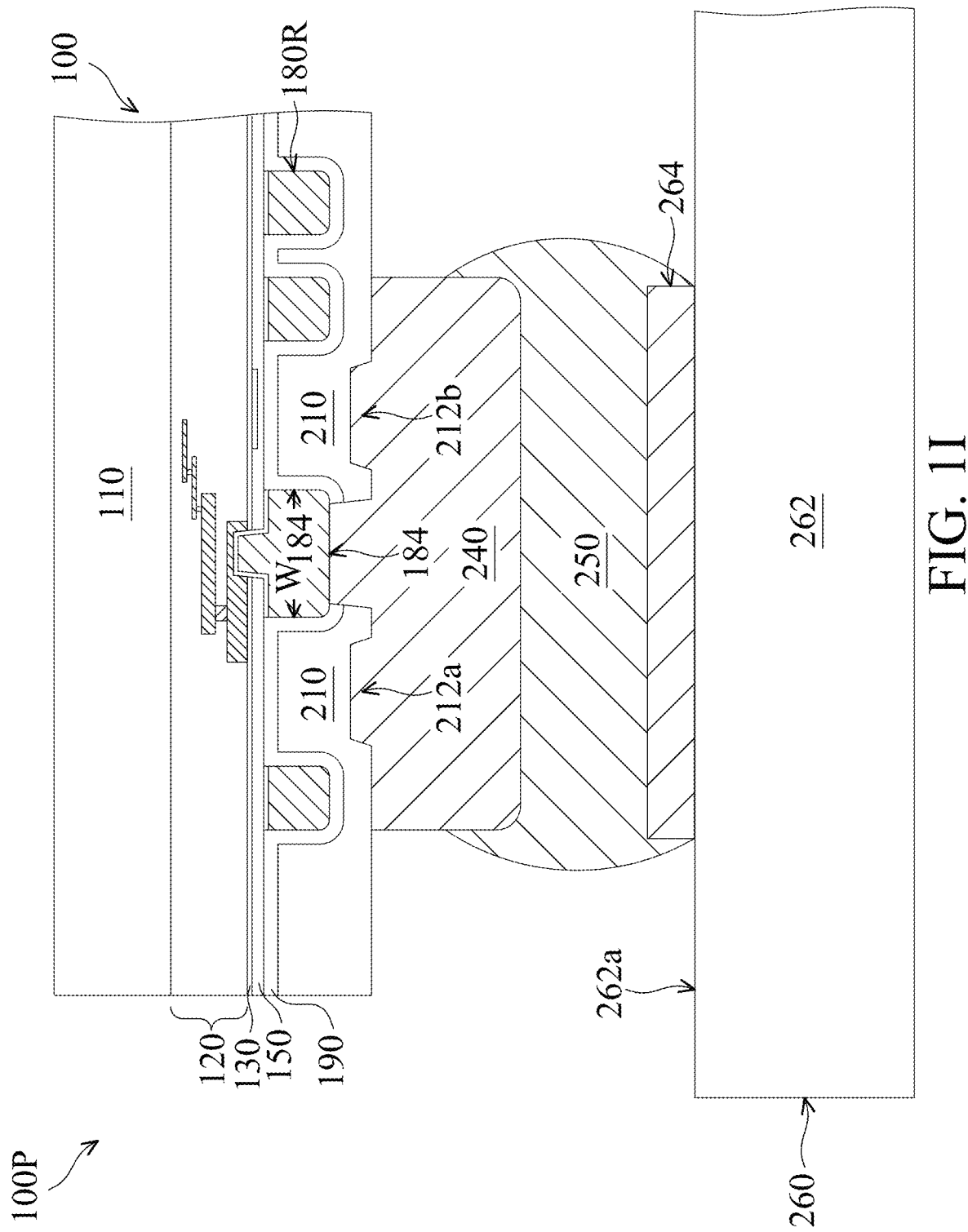

As shown in FIG. 1I, the chip structure 100 is bonded to a wiring substrate 260 through the solder bump 250, in accordance with some embodiments. In this step, a chip package structure 100P is substantially formed, in accordance with some embodiments. The wiring substrate 260 includes a wiring structure 262 and a conductive pad 264, in accordance with some embodiments.

The wiring structure 262 includes a dielectric structure, wiring layers, and conductive vias, in accordance with some embodiments. The wiring layers and the conductive vias are formed in the dielectric structure, in accordance with some embodiments. The conductive vias are electrically connected between different wiring layers and between the wiring layer and the conductive pad 264, in accordance with some embodiments.

The dielectric structure is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric structure is formed using deposition processes (e.g. chemical vapor deposition processes or physical vapor deposition processes), photolithography processes, and etching processes, in accordance with some embodiments.

The wiring layers are made of a conductive material, such as metal (e.g. copper, aluminum, or tungsten) or alloys thereof, in accordance with some embodiments. The conductive vias are made of a conductive material, such as metal (e.g. copper, aluminum, or tungsten) or alloys thereof, in accordance with some embodiments.

The conductive pad 264 is over a top surface 262a of the wiring structure 262, in accordance with some embodiments. The conductive pad 264 is made of a conductive material, such as metal (e.g. copper, aluminum, or tungsten) or alloys thereof, in accordance with some embodiments. In some embodiments, the wiring layers, the conductive vias, and the conductive pad 264 are made of the same material. In some other embodiments, the wiring layers, the conductive vias, and the conductive pad 264 are made of different materials.

Figure 2:
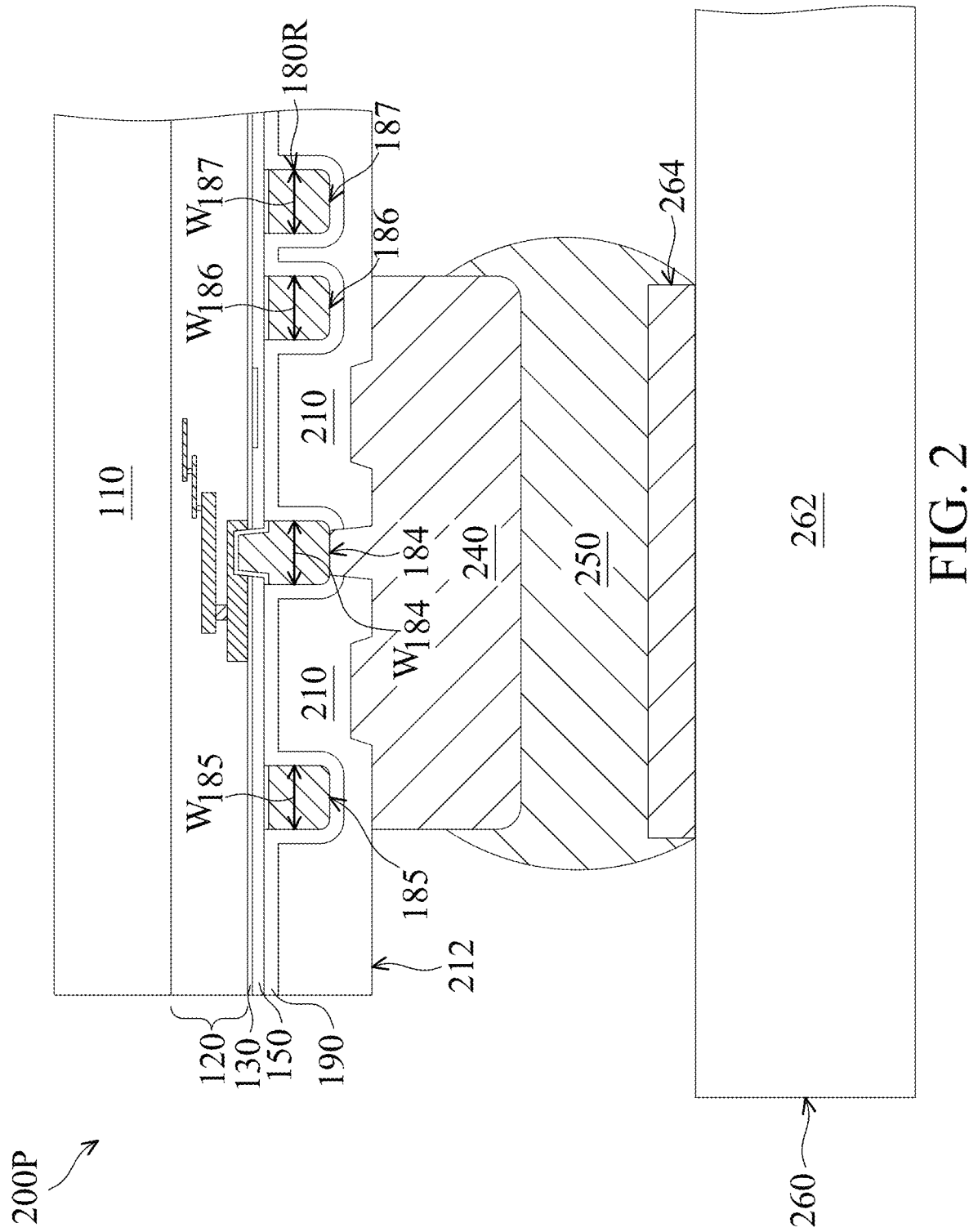
FIG. 2 is a cross-sectional view illustrating a chip package structure, in accordance with some embodiments.

FIG. 2 is a cross-sectional view illustrating a chip package structure 200P, in accordance with some embodiments. As shown in FIG. 2, the chip package structure 200P is similar to the chip package structure 100P of FIG. 1I, except that the linewidth $W_{184}$ of the conductive line 184 is substantially equal to the linewidth $W_{185}$, $W_{186}$, or $W_{187}$ of the conductive line 185, 186, or 187, which reserves more space for wiring layout.

Figure 3A:
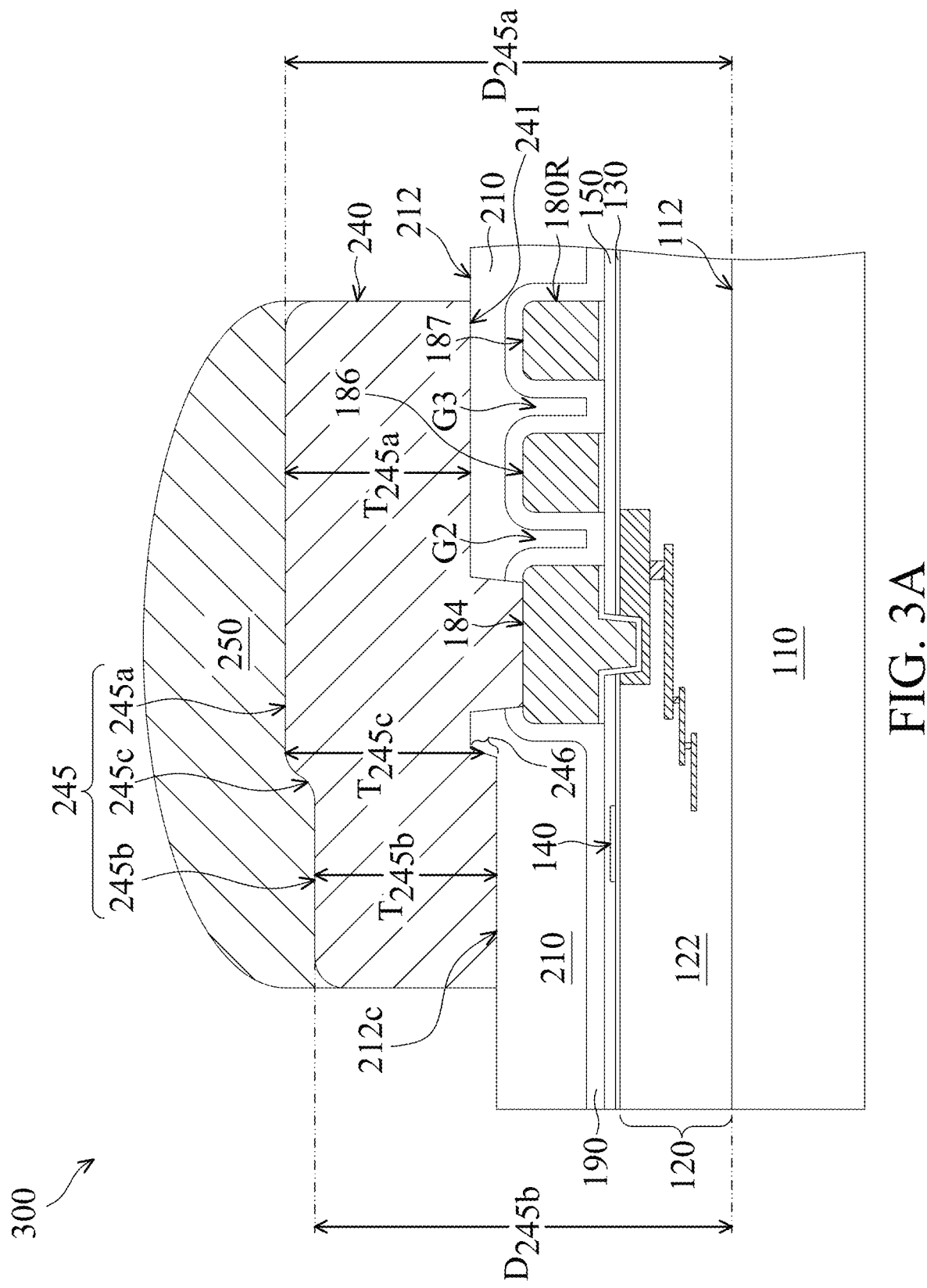
FIGS. 3A-3B are cross-sectional views of various stages of a process for forming a chip package structure, in accordance with some embodiments.
Figures 1, 3A:
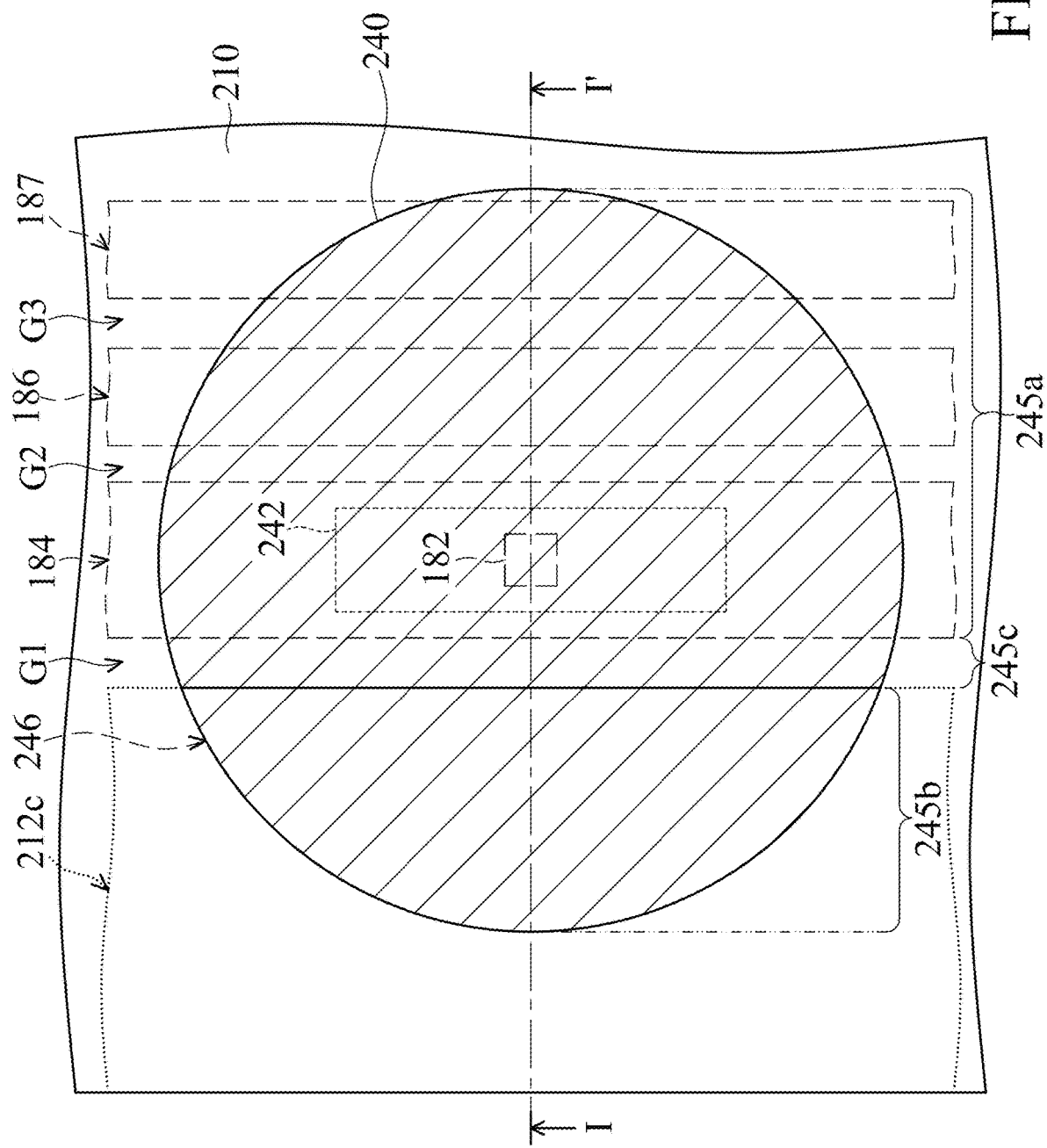
Figure 3B:
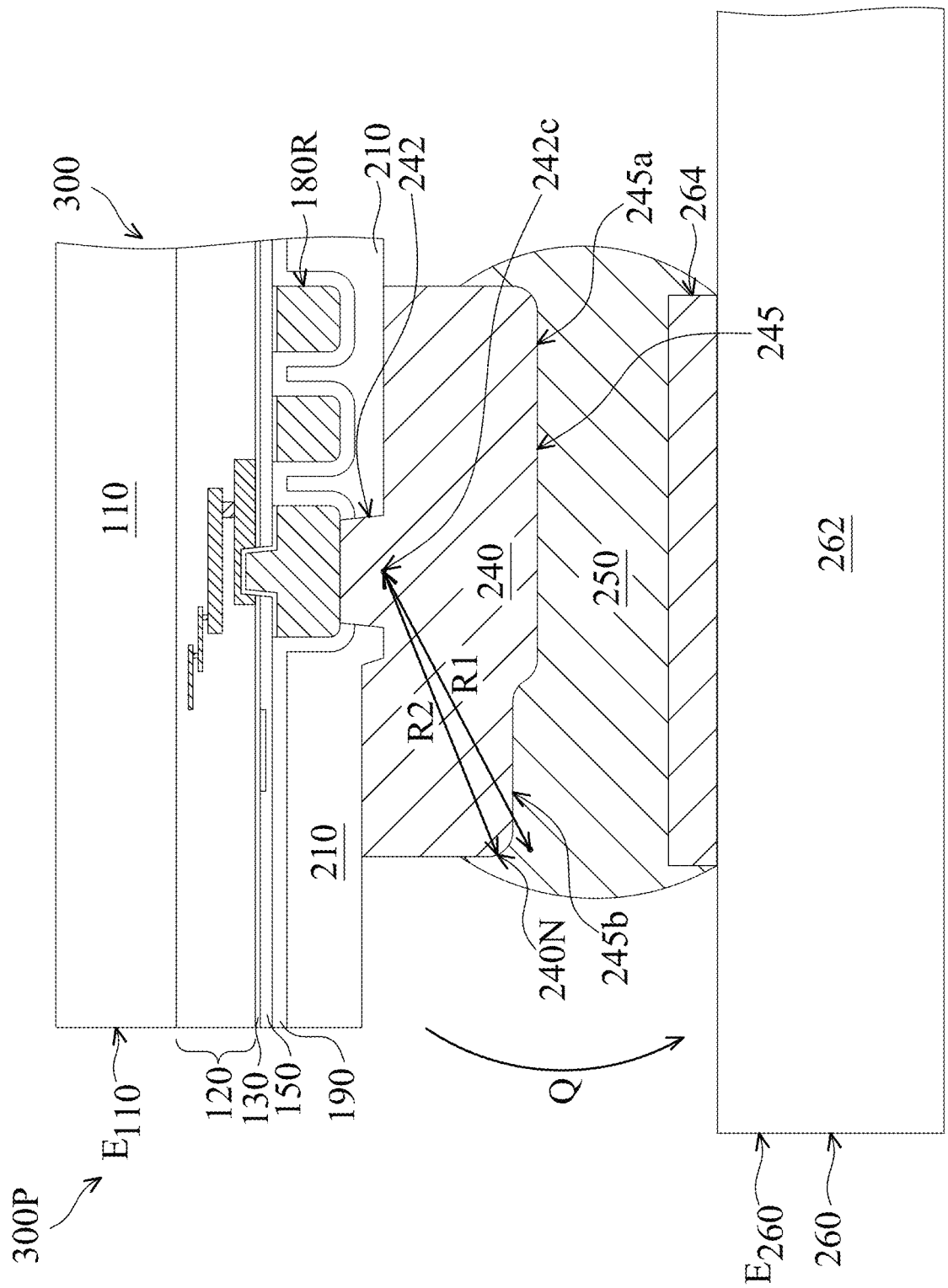

FIGS. 3A-3B are cross-sectional views of various stages of a process for forming a chip package structure 300P, in accordance with some embodiments. FIG. 3A-1 is a top view of a chip structure 300 of FIG. 3A, in accordance with some embodiments. For the sake of simplicity, FIG. 3A-1 omits the solder bump 250 of FIG. 3A, in accordance with some embodiments.

As shown in FIGS. 3A and 3A-1, the chip structure 300 is similar to the chip structure 100 of FIG. 1H, except that the upper surface 245 is not a planar surface, the conductive line 185 is not formed, the gap G2 between the conductive lines 184 and 186 is narrowed, and the conductive line 187 is under the conductive pillar 240, in accordance with some embodiments.

The upper surface 245 has parts 245a and 245b and a sloping part 245c, in accordance with some embodiments. The part 245a is over the conductive lines 184, 186 and 187, in accordance with some embodiments. The part 245b is not over the conductive line of the wiring layer 180R, in accordance with some embodiments. The sloping part 245c is connected between the parts 245a and 245b, in accordance with some embodiments. The wiring layer 180R under the part 245a of the upper surface 245 has a higher wiring density than the wiring layer 180R under the part 245b of the upper surface 245, in accordance with some embodiments.

The part 245a is higher than the part 245b, in accordance with some embodiments. That is, a distance $D_{245a}$ between the part 245a and the top surface 112 of the substrate 110 is greater than a distance $D_{245b}$ between the part 245b and the top surface 112, in accordance with some embodiments.

The top surface 212 of the insulating layer 210 has a recess 212c, in accordance with some embodiments. The part 245b is over the recess 212c, in accordance with some embodiments. The conductive pillar 240 has a protruding locking portion 246 protruding from the lower surface 241 of the conductive pillar 240, in accordance with some embodiments. The protruding locking portion 246 is in the recess 212c, in accordance with some embodiments. The protruding locking portion 246 is under the part 245b, in accordance with some embodiments.

The conductive pillar 240 having the part 245a of the upper surface 245 and the conductive pillar 240 having the part 245b of the upper surface 245 have a substantially same thickness, in accordance with some embodiments. That is, a thickness $T_{245a}$ of the conductive pillar 240 having the part 245a of the upper surface 245 is substantially equal to a thickness $T_{245b}$ of the conductive pillar 240 having the part 245b of the upper surface 245, in accordance with some embodiments. The thickness $T_{245a}$ or $T_{245b}$ is substantially equal to a thickness $T_{245c}$ of the conductive pillar 240 having the sloping part 245c of the upper surface 245, in accordance with some embodiments.

As shown in FIG. 3A-1, the part 245b of the upper surface 245 or the protruding locking portion 246 of the conductive pillar 240 has a substantially D shape, in accordance with some embodiments. As shown in FIG. 3A-1, the conductive lines 184, 186, and 187 are substantially parallel to each other, which improves the planarity of the part 245a of the upper surface 245, in accordance with some embodiments. As shown in FIG. 3A, the part 245b of the upper surface 245 is referred to as a recess, and the recess is filled with the solder bump 250, in accordance with some embodiments.

As shown in FIG. 3B, the step of FIG. 1I is performed to bond the chip structure 300 to a wiring substrate 260 through the solder bump 250, in accordance with some embodiments. In this step, a chip package structure 300P is substantially formed, in accordance with some embodiments.

The substrate 110 has an edge $E_{110}$, in accordance with some embodiments. The wiring substrate 260 has an edge $E_{260}$, in accordance with some embodiments. The substrate 110 has a coefficient of thermal expansion (CTE) ranging from about 1 ppm/° C. to about 5 ppm/° C., in accordance with some embodiments. The wiring substrate 260 has a coefficient of thermal expansion (CTE) ranging from about 10 ppm/° C. to about 20 ppm/° C., in accordance with some embodiments.

Since the CTE of the substrate 110 is much lower than that of the wiring substrate 260, a portion of the substrate 110 close to the edge $E_{110}$ may apply a counterclockwise torque Q to the wiring substrate 260 close to the edge $E_{260}$ after a cooling process, which is performed after a bonding process. Since the (lower) part 245b of the upper surface 245 is formed, the distance between a corner 240N and a center portion 242c of the protruding connecting portion 242 is reduced from R1 to R2, and therefore the counterclockwise torque Q is reduced, in accordance with some embodiments. Therefore, the stress at the boundary between the conductive pillar 240 and the solder bump 250 is reduced, which prevents the solder bump 250 close to the boundary from cracking, in accordance with some embodiments. Therefore, the reliability of the chip package structure 300P is improved, in accordance with some embodiments.

Figure 4A:
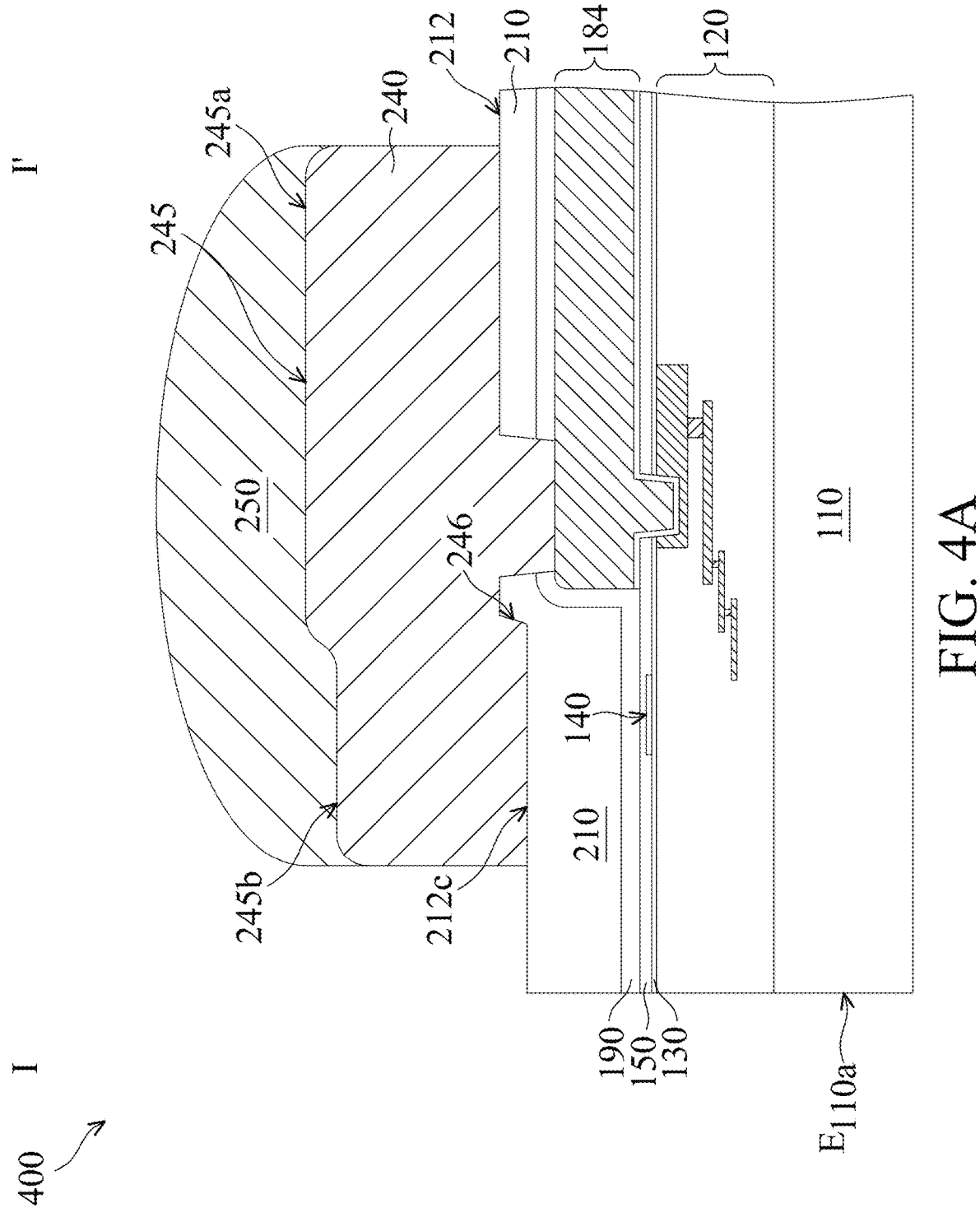
FIGS. 4A-4B are cross-sectional views of various stages of a process for forming a chip package structure, in accordance with some embodiments.
Figures 1, 4A:
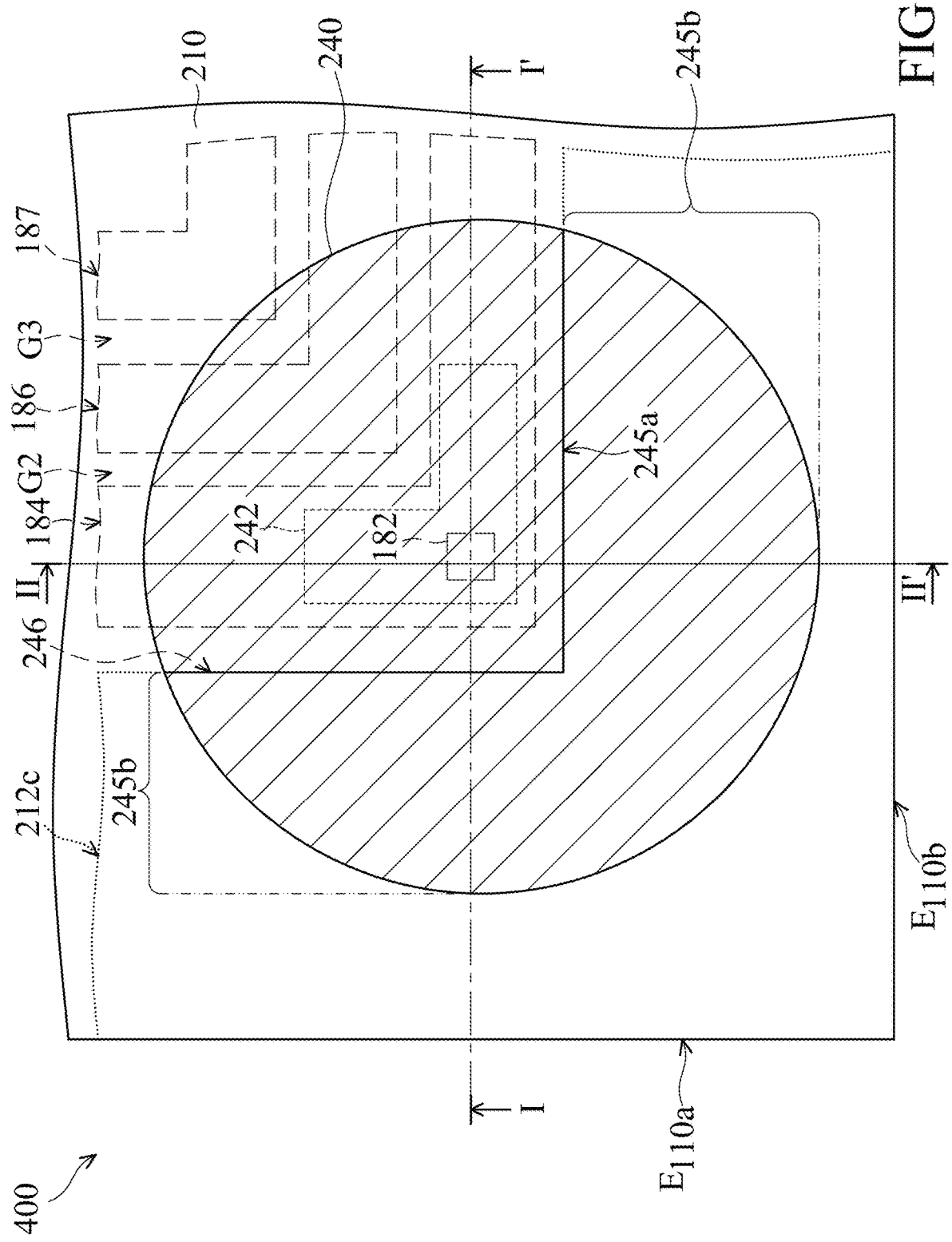
Figures 2, 4A:
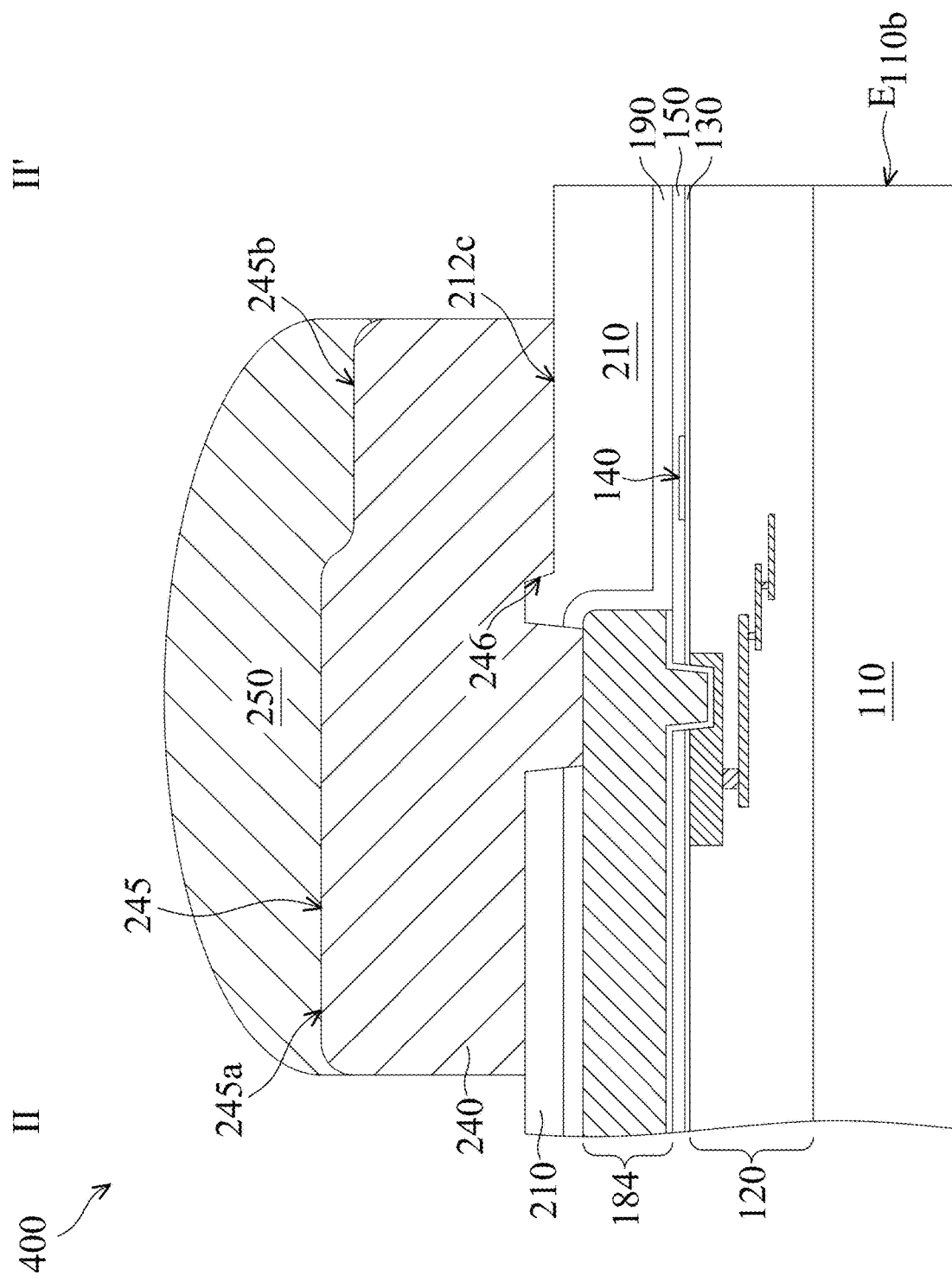
Figure 4B:
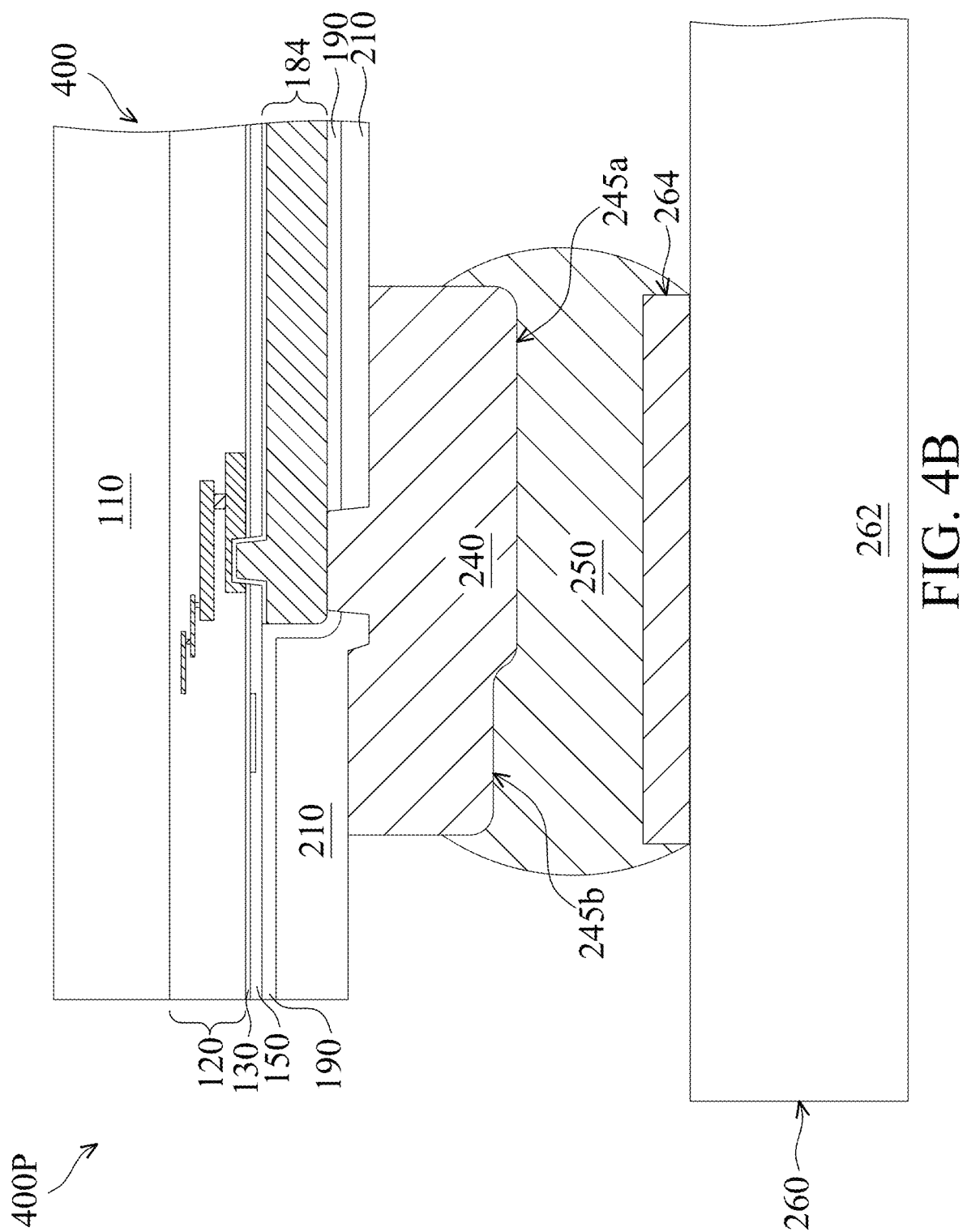

FIGS. 4A-4B are cross-sectional views of various stages of a process for forming a chip package structure, in accordance with some embodiments. FIG. 4A-1 is a top view of a chip structure 400 of FIG. 4A, in accordance with some embodiments. For the sake of simplicity, FIG. 4A-1 omits the solder bump 250 of FIG. 4A, in accordance with some embodiments. FIG. 4A-2 is a cross-sectional view illustrating the chip structure 400 along a sectional line II-II' in FIG. 4A-1, in accordance with some embodiments.

As shown in FIGS. 4A, 4A-1, and 4A-2, the chip structure 400 is similar to the chip structure 300 of FIG. 3A, except that the conductive lines 184, 186 and 187 under the conductive pillar 240 has a substantially L shape, in accordance with some embodiments. Therefore, the part 245b of the upper surface 245 has a substantially L shape, in accordance with some embodiments. The protruding locking portion 246 of the conductive pillar 240 has a substantially L shape, in accordance with some embodiments.

As shown in FIGS. 4A and 4A-1, the part 245b of the upper surface 245 is closer to an edge $E_{110a}$ of the substrate 110 than the part 245a, in accordance with some embodiments. The part 245b is between the part 245a and the edge $E_{110a}$, in accordance with some embodiments.

As shown in FIGS. 4A-1 and 4A-2, the part 245b of the upper surface 245 is closer to an edge $E_{110b}$ of the substrate 110 than the part 245a, in accordance with some embodiments. The part 245b is between the part 245a and the edge $E_{110b}$, in accordance with some embodiments.

As shown in FIG. 4B, the step of FIG. 1I is performed to bond the chip structure 400 to a wiring substrate 260 through the solder bump 250, in accordance with some embodiments. In this step, a chip package structure 400P is substantially formed, in accordance with some embodiments.

Figure 5A:
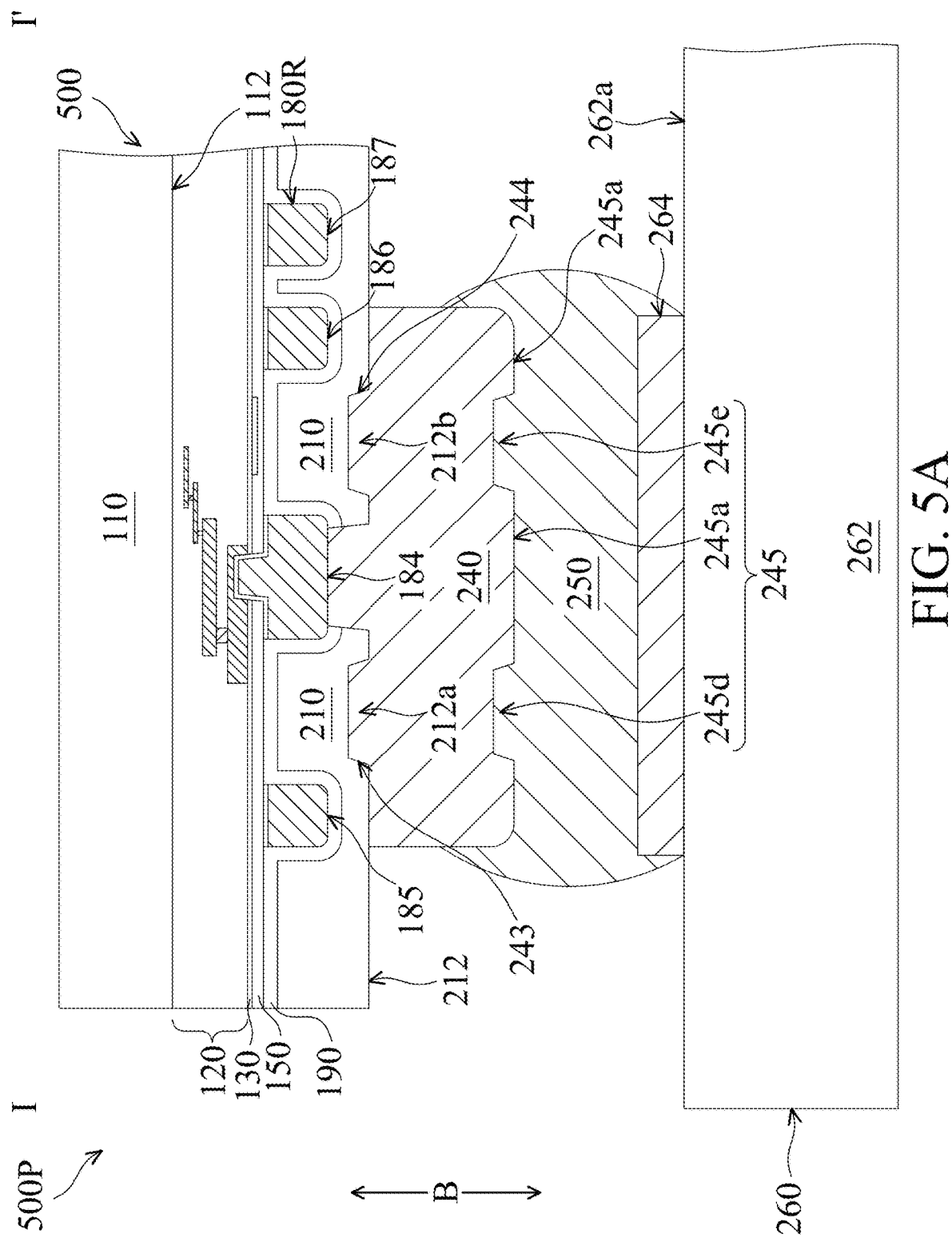
FIG. 5A is a cross-sectional view illustrating a chip package structure, in accordance with some embodiments.
Figure 5B:
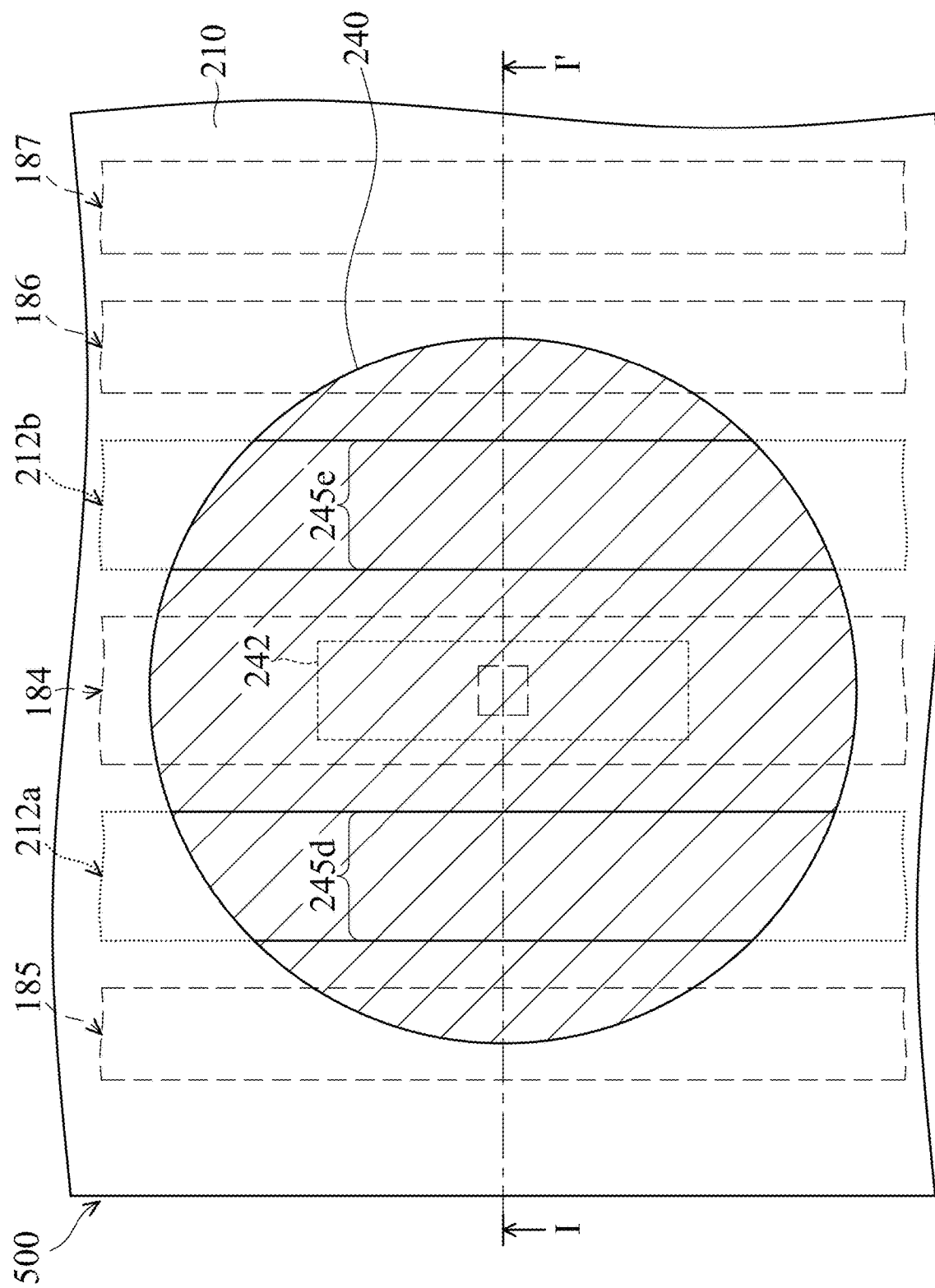
FIG. 5B is a bottom view of a chip structure of FIG. 5A, in accordance with some embodiments.

FIG. 5A is a cross-sectional view illustrating a chip package structure 500P, in accordance with some embodiments. FIG. 5B is a bottom view of a chip structure 500 of FIG. 5A, in accordance with some embodiments. For the sake of simplicity, FIG. 5B omits the solder bump 250 of FIG. 5A, in accordance with some embodiments.

As shown in FIGS. 5A and 5B, the chip structure 500 is similar to the chip structure 100 of FIG. 1H, the chip package structure 500P is similar to the chip package structure 100P of FIG. 1I, except that the upper surface 245 of the conductive pillar 240 has parts 245a, 245d and 245e, and the parts 245d and 245e are closer to the substrate 110 than the part 245a, in accordance with some embodiments.

The part 245d, the protruding locking portion 243 of the conductive pillar 240, and the recess 212a of the insulating layer 210 are aligned with each other in a direction B perpendicular to the top surface 112 of the substrate 110, in accordance with some embodiments.

The part 245e, the protruding locking portion 244 of the conductive pillar 240, and the recess 212b of the insulating layer 210 are aligned with each other in the direction B, in accordance with some embodiments. As shown in FIG. 5B, the parts 245d and 245e have a strip shape, in accordance with some embodiments.

Figure 6A:
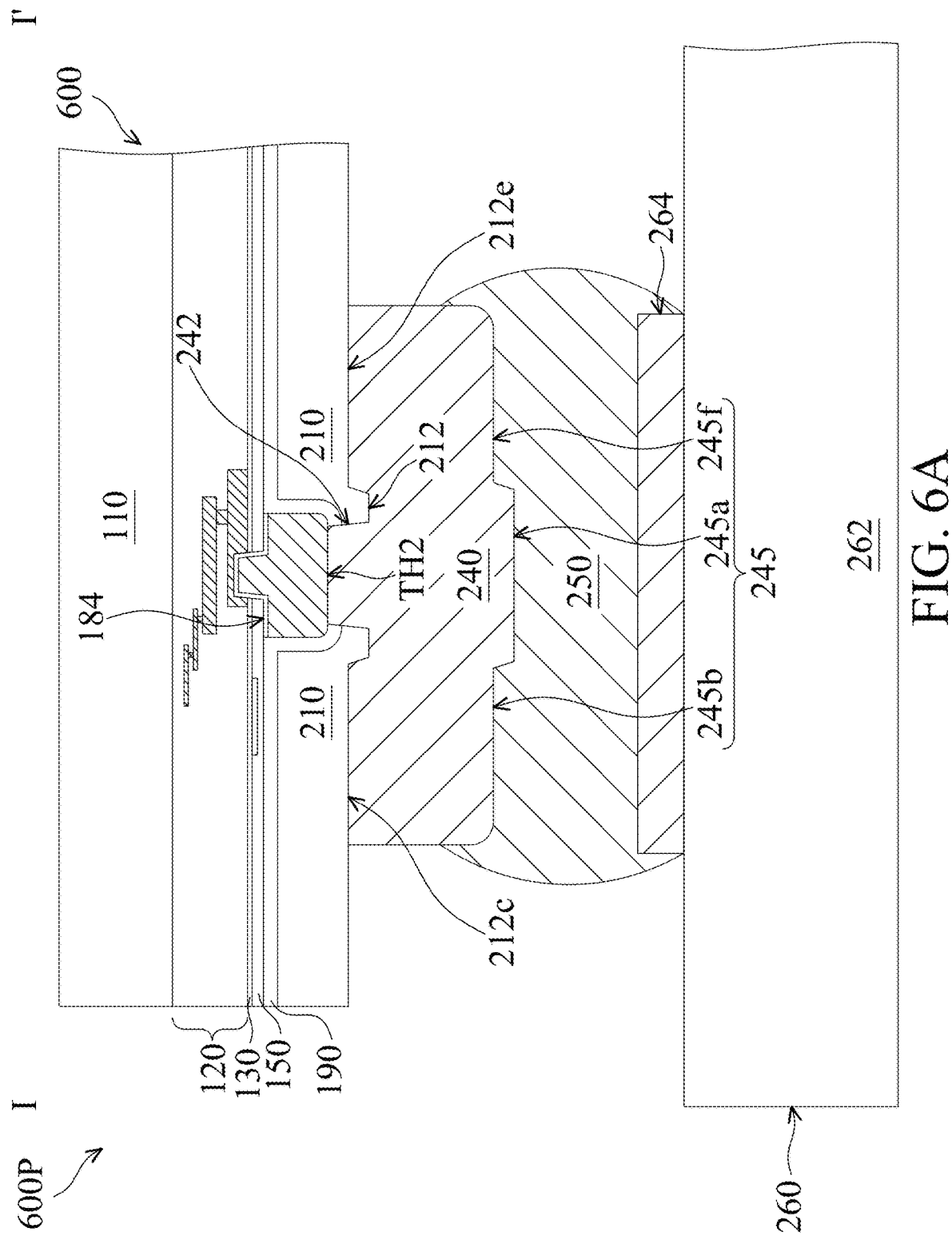
FIG. 6A is a cross-sectional view illustrating a chip package structure, in accordance with some embodiments.
Figure 6B:
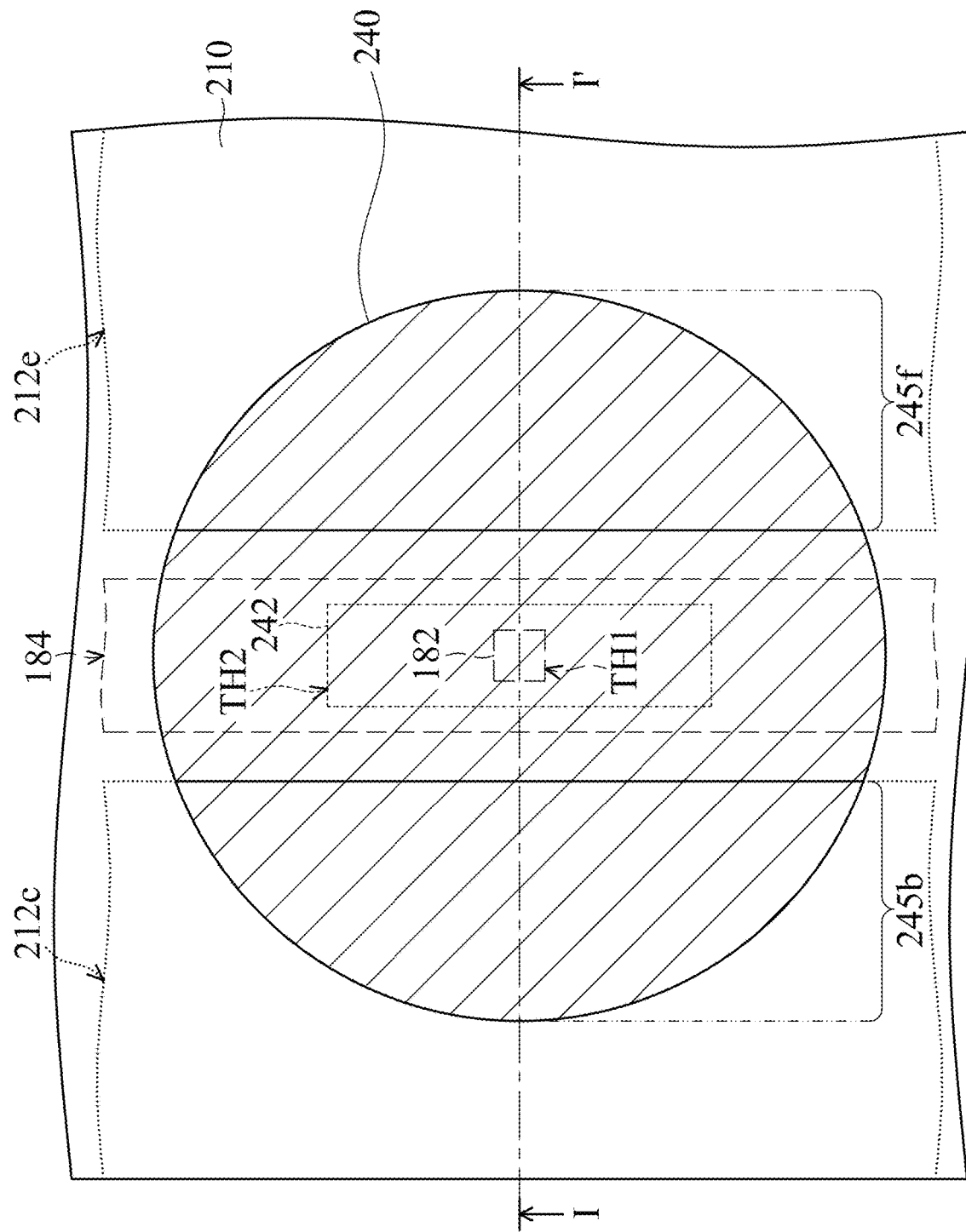
FIG. 6B is a bottom view of a chip structure of FIG. 6A, in accordance with some embodiments.

FIG. 6A is a cross-sectional view illustrating a chip package structure 600P, in accordance with some embodiments. FIG. 6B is a bottom view of a chip structure 600 of FIG. 6A, in accordance with some embodiments. For the sake of simplicity, FIG. 6B omits the solder bump 250 of FIG. 6A, in accordance with some embodiments.

As shown in FIGS. 6A and 6B, the chip structure 600 is similar to the chip structure 300 of FIG. 3A, the chip package structure 600P is similar to the chip package structure 300P of FIG. 3B, except that the chip structure 600 does not have the conductive lines 186 and 187, and the upper surface 245 further has a part 245f, in accordance with some embodiments. The part 245f is closer to the substrate 110 than the part 245a, in accordance with some embodiments. As shown in FIG. 6B, the parts 245b and 245f have a substantially D shape, in accordance with some embodiments.

Figure 7:
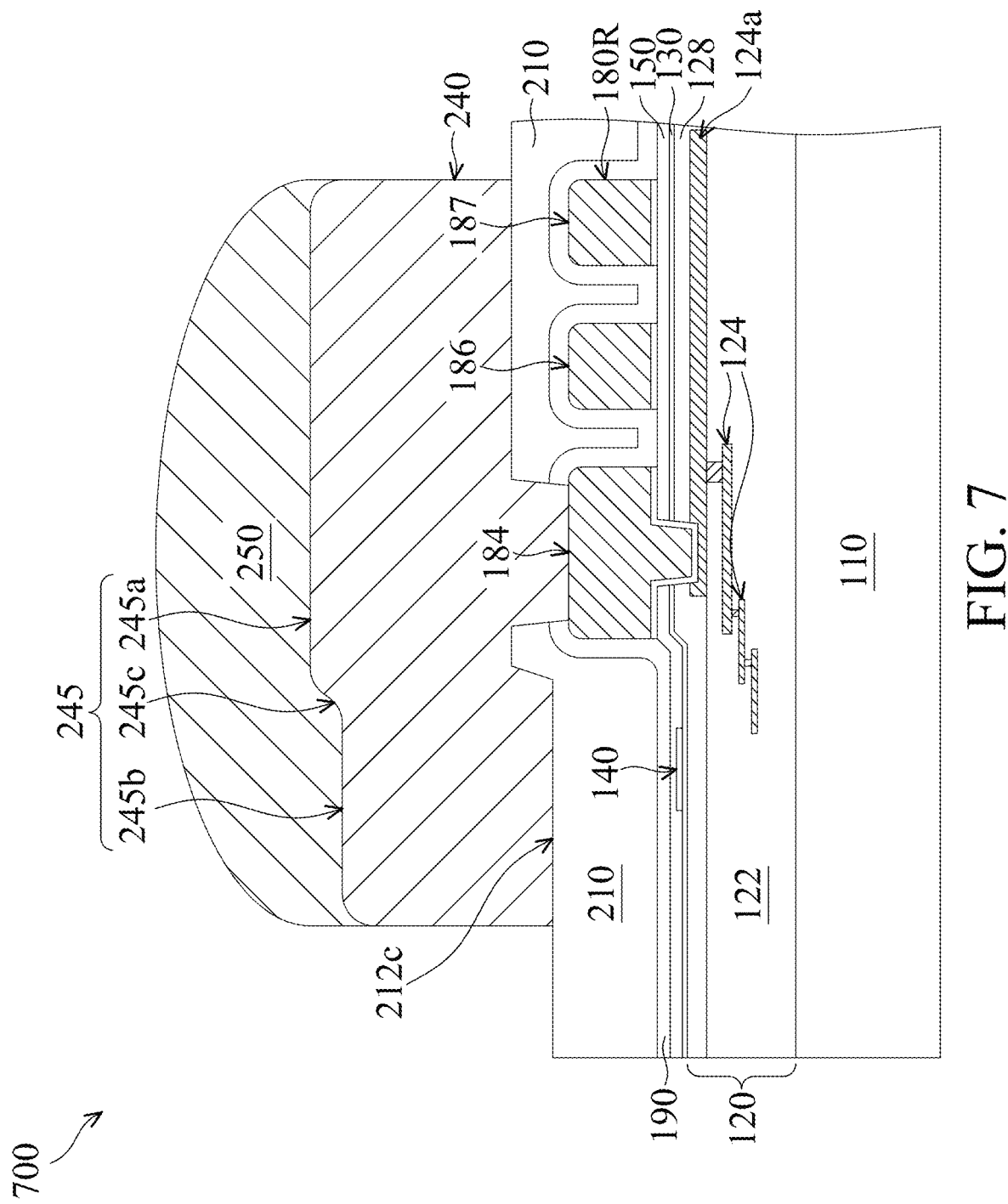
FIG. 7 is a cross-sectional view illustrating a chip structure, in accordance with some embodiments.

FIG. 7 is a cross-sectional view illustrating a chip structure 700, in accordance with some embodiments. As shown in FIG. 7, the chip structure 700 is similar to the chip structure 300 of FIG. 3A, except that the wiring layer 124a under the part 245a of the upper surface 245 of the conductive pillar 240 has a higher wiring density than the wiring layer 124a under the part 245b of the upper surface 245, in accordance with some embodiments.

The interconnect structure 120 further includes a dielectric layer 128, in accordance with some embodiments. The dielectric layer 128 covers the wiring layer 124a and the dielectric structure 122, in accordance with some embodiments. The dielectric layer 128 is made of an oxide-containing material (e.g. silicon oxide or undoped silicate glass) or another suitable insulating material, in accordance with some embodiments.

Processes and materials for forming the chip structures 300, 400, 500, 600, and 700 may be similar to, or the same as, those for forming the chip structure 100 described above. Processes and materials for forming the chip package structures 200P, 300P, 400P, 500P, and 600P may be similar to, or the same as, those for forming the chip package structure 100P described above.

For the sake of simplicity, only one conductive pillar 240 and one solder bump 250 are shown in the drawings. However, embodiments of the disclosure are not limited thereto. In some embodiments, the chip structure includes multiple conductive pillars and multiple solder bumps.

In accordance with some embodiments, chip structures and methods for forming the same are provided. The methods (for forming the chip structure) form a conductive pillar with a protruding locking portion or a recess by locally adjusting a wiring density of a wiring layer under the conductive pillar. The protruding locking portion is embedded in an insulating layer under the conductive pillar. The design of the protruding locking portion facilitates locking of the conductive pillar to the insulating layer, which improves the reliability of the chip structure. The recess of the conductive pillar is able to reduce the torque resulting from thermal expansion mismatches, which reduces the stress at the boundary between the conductive pillar and a solder bump so as to prevent the solder bump close to the boundary from cracking.

In accordance with some embodiments, a chip structure is provided. The chip structure includes a substrate. The chip structure includes a first conductive line over the substrate. The chip structure includes an insulating layer over the substrate and the first conductive line. The chip structure includes a conductive pillar over the insulating layer. The conductive pillar is formed in one piece, the conductive pillar has a lower surface, a protruding connecting portion, and a protruding locking portion, the protruding connecting portion protrudes from the lower surface and passes through the insulating layer and is in direct contact with the first conductive line, the protruding locking portion protrudes from the lower surface and is embedded in the insulating layer, the protruding locking portion has an end surface facing the substrate, and a first portion of the insulating layer is between the end surface and the substrate. The chip structure includes a solder bump on the conductive pillar. The solder bump is in direct contact with the conductive pillar.

In accordance with some embodiments, a chip structure is provided. The chip structure includes a substrate. The chip structure includes a first conductive line over the substrate. The chip structure includes an insulating layer over the substrate and the first conductive line. The chip structure includes a conductive pillar over the insulating layer covering the first conductive line. The conductive pillar is formed in one piece, the conductive pillar has an upper surface having a first part and a second part, the first part is over the first conductive line, the second part is not over the first conductive line, and a first distance between the first part and the substrate is greater than a second distance between the second part and the substrate. The chip structure includes a solder bump on the conductive pillar. The solder bump is in direct contact with the conductive pillar.

In accordance with some embodiments, a method for forming a chip structure is provided. The method includes forming a first conductive line over a substrate. The method includes forming an insulating layer over the substrate and the first conductive line. The insulating layer has a first recess, and a first edge of the first conductive line is substantially parallel to a second edge of the first recess in a top view of the first conductive line and the insulating layer. The method includes forming a conductive pillar over the insulating layer covering the first conductive line. The conductive pillar is formed in one piece, the conductive pillar has a protruding locking portion in the first recess, the protruding locking portion has an end surface facing the substrate, and a first portion of the insulating layer is between the end surface and the substrate. The method includes forming a solder bump on the conductive pillar. The solder bump is in direct contact with the conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip structure, comprising:
    a substrate;
    a first conductive line over the substrate;
    an insulating layer over the substrate and the first conductive line;
    a conductive pillar over the insulating layer, wherein the conductive pillar is formed in one piece, the conductive pillar has a lower surface, a protruding connecting portion, and a protruding locking portion, the protruding connecting portion protrudes from the lower surface and passes through the insulating layer and is in direct contact with the first conductive line, the protruding locking portion protrudes from the lower surface and is embedded in the insulating layer, the insulating layer separates the protruding locking portion from the substrate, the protruding locking portion is wider than the protruding connecting portion, and the protruding locking portion has a strip shape in a first top view of the conductive pillar and the first conductive line; and
    a solder bump on the conductive pillar, wherein the solder bump is in direct contact with the conductive pillar.

2. The chip structure as claimed in claim 1, a width of the protruding connecting portion is less than a line width of the first conductive line.

3. The chip structure as claimed in claim 1, further comprising:
    a second conductive line between the substrate and the conductive pillar, wherein a first top surface of the first conductive line is substantially level with a second top surface of the second conductive line, and the protruding locking portion of the conductive pillar is between the first conductive line and the second conductive line in a second top view of the conductive pillar, the first conductive line, and the second conductive line.

4. The chip structure as claimed in claim 3, wherein there is no conductive line between the first conductive line and the second conductive line.

5. The chip structure as claimed in claim 1, wherein a first longitudinal axis of the protruding locking portion is substantially parallel to a portion of the first conductive line under the conductive pillar in the first top view of the conductive pillar and the first conductive line.

6. The chip structure as claimed in claim 5, wherein the protruding connecting portion has a strip shape, and a second longitudinal axis of the protruding connecting portion is substantially parallel to the first longitudinal axis of the protruding locking portion in the first top view of the conductive pillar and the first conductive line.

7. The chip structure as claimed in claim 1, wherein the insulating layer is a single-layered structure.

8. A chip structure, comprising:
a substrate;
a conductive line over the substrate;
an insulating layer over the substrate and the conductive line;
a conductive pillar over the insulating layer covering the conductive line, wherein the conductive pillar has a first sidewall and a second sidewall opposite to the first sidewall, the first sidewall and the second sidewall overlap the conductive line in a first top view of the conductive line and the conductive pillar, the conductive pillar has an upper surface having a first part and a second part, the first part is over the conductive line, the second part is not over the conductive line, the first part is higher than the second part, and the conductive pillar is in contact with the conductive line; and
a solder bump on the conductive pillar, wherein the solder bump is in contact with the conductive pillar.

9. The chip structure as claimed in claim 8, wherein the conductive pillar further has a protruding connecting portion and a protruding locking portion, the protruding connecting portion protrudes from a lower surface of the conductive pillar and passes through the insulating layer and is in direct contact with the conductive line, the protruding locking portion protrudes from the lower surface of the conductive pillar and is spaced apart from the conductive line, and the protruding locking portion is longer than the protruding connecting portion in a second top view of the protruding locking portion and the protruding connecting portion.

10. The chip structure as claimed in claim 8, wherein the conductive pillar having the first part of the upper surface and the conductive pillar having the second part of the upper surface have a substantially same thickness.

11. The chip structure as claimed in claim 8, wherein the second part of the upper surface has a substantially D shape, a substantially L shape, or a strip shape.

12. A method for forming a chip structure, comprising:
forming a first conductive line over a substrate;
forming an insulating layer over the substrate and the first conductive line, wherein the insulating layer has a first recess, and the first recess has a strip shape in a first top view of the insulating layer;
forming a conductive pillar over the insulating layer covering the first conductive line, wherein the conductive pillar has a protruding locking portion in the first recess, the protruding locking portion has a trapezoid shape in a cross-sectional view of the conductive pillar, and a first portion of the insulating layer separates the protruding locking portion from the substrate; and
forming a solder bump on the conductive pillar, wherein the solder bump is in contact with the conductive pillar.

13. The method for forming the chip structure as claimed in claim 12, wherein the insulating layer further has a through hole, the through hole exposes a second portion of the first conductive line, the conductive pillar further has a protruding connecting portion in the through hole, and the protruding connecting portion is in direct contact with the second portion of the first conductive line.

14. The chip structure as claimed in claim 13, wherein a first bottom surface of the protruding connecting portion is closer to the substrate than a second bottom surface of the protruding locking portion.

15. The method for forming the chip structure as claimed in claim 12, wherein a linewidth of a second portion of the first conductive line under the conductive pillar is less than a width of the conductive pillar.

16. The method for forming the chip structure as claimed in claim 12, further comprising:
forming a second conductive line over the substrate while forming the first conductive line over the substrate, wherein the second conductive line is between the substrate and the conductive pillar, a first top surface of the first conductive line is substantially level with a second top surface of the second conductive line, and the protruding locking portion of the conductive pillar is between the first conductive line and the second conductive line in a second top view of the conductive pillar, the first conductive line, and the second conductive line.

17. The method for forming the chip structure as claimed in claim 16, wherein there is no conductive line between the first conductive line and the second conductive line.

18. The method for forming the chip structure as claimed in claim 12, wherein the first recess of the insulating layer extends across a sidewall of the solder bump in a second top view of the insulating layer and the solder bump.

19. The method for forming the chip structure as claimed in claim 12, wherein the first recess of the insulating layer is longer than the conductive pillar.

20. The method for forming the chip structure as claimed in claim 12, wherein a portion of the first recess of the insulating layer is not covered by the conductive pillar.

* * * * *